US012119360B2

(12) United States Patent
Brady et al.

(10) Patent No.: US 12,119,360 B2
(45) Date of Patent: Oct. 15, 2024

(54) CAPACITANCE MATCHED METAL WIRINGS IN DUAL CONVERSION GAIN PIXELS

(71) Applicant: SONY SEMICONDUCTOR SOLUTIONS CORPORATION, Kanagawa (JP)

(72) Inventors: Frederick Brady, Webster, NY (US); Adarsh Basavalingappa, Fairport, NY (US); Taisuke Suwa, Auderghem (BE); Michiel Timmermans, Werchter (BE); Sungin Hwang, Pittsford, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 525 days.

(21) Appl. No.: 17/610,264

(22) PCT Filed: May 21, 2020

(86) PCT No.: PCT/IB2020/000399
§ 371 (c)(1),
(2) Date: Nov. 10, 2021

(87) PCT Pub. No.: WO2020/234649
PCT Pub. Date: Nov. 26, 2020

(65) Prior Publication Data
US 2022/0216253 A1 Jul. 7, 2022

Related U.S. Application Data

(60) Provisional application No. 62/850,922, filed on May 21, 2019.

(51) Int. Cl.
*H01L 27/146* (2006.01)

(52) U.S. Cl.
CPC .. *H01L 27/14614* (2013.01); *H01L 27/14636* (2013.01)

(58) Field of Classification Search
CPC .......................................... H01L 27/146–14893
See application file for complete search history.

(56) References Cited

U.S. PATENT DOCUMENTS 8,653,566 B2 * 2/2014 Ohtsuki ............ H01L 27/14636
257/233
9,324,758 B2 * 4/2016 Oh .................... H01L 27/14643
(Continued)

FOREIGN PATENT DOCUMENTS

EP 2226844 9/2010

OTHER PUBLICATIONS

International Search Report prepared by the European Patent Office on Jul. 28, 2020, for International Application No. PCT/IB2020/000399, 3 pgs.

(Continued)

*Primary Examiner* — Eric A. Ward
(74) *Attorney, Agent, or Firm* — Sheridan Ross PC

(57) ABSTRACT

An imaging device includes a pixel including a photoelectric conversion region, a first transfer transistor coupled to the photoelectric conversion region, a first floating diffusion, a second floating diffusion, a second transfer transistor coupled between the first floating diffusion and the second floating diffusion to control access to the second floating diffusion, a third transfer transistor coupled to the photoelectric conversion region, a third floating diffusion coupled, a fourth floating diffusion, and a fourth transfer transistor coupled between the third floating diffusion and the fourth floating diffusion to control access to the fourth floating diffusion. The imaging device includes a first wiring layer including a first wiring connected to the second floating (Continued)

diffusion, a second wiring connected to the fourth floating diffusion, and a third wiring connected to ground and capacitively coupled with the first wiring and the second wiring.

20 Claims, 32 Drawing Sheets

(56) References Cited

U.S. PATENT DOCUMENTS

| | | | |
|---|---|---|---|
| 9,673,237 B2* | 6/2017 | Kim | H01L 27/14612 |
| 2006/0219868 A1 | 10/2006 | Morimoto et al. | |
| 2010/0225776 A1 | 9/2010 | Taura | |
| 2011/0019049 A1* | 1/2011 | Jin | H04N 25/766 |
| | | | 257/292 |
| 2014/0085520 A1 | 3/2014 | Taura | |
| 2019/0027516 A1 | 1/2019 | Buettgen et al. | |

OTHER PUBLICATIONS

Written Opinion prepared by the European Patent Office on Jul. 28, 2020, for International Application No. PCT/IB2020/000399, 8 pgs.

* cited by examiner

CAPACITANCE MATCHED METAL WIRINGS IN DUAL CONVERSION GAIN PIXELS

CROSS REFERENCE TO RELATED APPLICATIONS

This application is a national stage application under 35 U.S.C. 371 and claims the benefit of PCT Application No. PCT/IB2020/000399 having an international filing date of 21 May 2020, which designated the United States, which PCT application claimed the benefit of U.S. Provisional Application No. 62/850,922 filed 21 May 2019, the entire disclosures of each of which are incorporated herein by reference.

FIELD

Example embodiments are directed to imaging devices, imaging apparatuses, and methods for operating the same, and more particularly, to imaging devices, imaging apparatuses, and methods for image sensing.

BACKGROUND

Image sensing has applications in many fields, including object tracking, environment rendering, etc. Some image sensors employ time-of-flight (ToF) principles to detect a distance or depth to an object or objects within a scene. In general, a ToF depth sensor includes a light source and an imaging device including a plurality of pixels for sensing reflected light. In operation, the light source emits light (e.g., infrared light) toward an object or objects in the scene, and the pixels detect the light reflected from the object or objects. The elapsed time between the initial emission of the light and receipt of the reflected light by each pixel may correspond to a distance from the object or objects. Direct ToF imaging devices may measure the elapsed time itself to calculate the distance while indirect ToF imaging devices may measure the phase delay between the emitted light and the reflected light and translate the phase delay into a distance. The depth values of the pixels are then used by the imaging device to determine a distance to the object or objects, which may be used to create a three dimensional scene of the captured object or objects.

SUMMARY

Example embodiments relate to imaging devices, imaging apparatuses, and methods thereof that enable dual conversion gain modes, improve low light performance and dynamic range, etc.

At least one example embodiment is directed to an imaging device including a pixel including a photoelectric conversion region, a first transfer transistor coupled to the photoelectric conversion region to transfer charge generated by the photoelectric conversion region, a first floating diffusion coupled to the first transfer transistor, a second floating diffusion, a second transfer transistor coupled between the first floating diffusion and the second floating diffusion to control access to the second floating diffusion, a third transfer transistor coupled to the photoelectric conversion region to transfer charge generated by the photoelectric conversion region, a third floating diffusion coupled to the second transfer transistor, a fourth floating diffusion, and a fourth transfer transistor coupled between the third floating diffusion and the fourth floating diffusion to control access to the fourth floating diffusion. The imaging device includes a first wiring layer including a first wiring connected to the second floating diffusion, a second wiring connected to the fourth floating diffusion, and a third wiring connected to ground and capacitively coupled with the first wiring and the second wiring.

According to at least one example embodiment, the first wiring overlaps the photoelectric conversion region and has a first pattern, the second wiring overlaps the photoelectric conversion region and has a second pattern, and the third wiring overlaps the photoelectric conversion region and has a third pattern.

According to at least one example embodiment, the third pattern has line symmetry in a first direction.

According to at least one example embodiment, the first pattern and the second pattern form a combination pattern that includes an interdigitated section where portions of the third wiring are interdigitated with portions of the first wiring and the second wiring.

According to at least one example embodiment, the interdigitated section has line symmetry in a first direction.

According to at least one example embodiment, the interdigitated section is asymmetrical.

According to at least one example embodiment, the wiring layer includes a fourth wiring that connects the first floating diffusion to a first amplification transistor, and a fifth wiring that connects the third floating diffusion to a second amplification transistor. The fourth and fifth wirings include dummy portions.

According to at least one example embodiment, patterns of the fourth wiring and the fifth wiring have point symmetry with respect to a reference point.

According to at least one example embodiment, the imaging device includes a second wiring layer including a fourth wiring connected to the second floating diffusion, a fifth wiring connected to the fourth floating diffusion, and a sixth wiring connected to ground and capacitively coupled to the fourth wiring and the fifth wiring.

According to at least one example embodiment, the fourth wiring overlaps the photoelectric conversion region and has a fourth pattern, the fifth wiring overlaps the photoelectric conversion region and has a fifth pattern, and the sixth wiring overlaps the photoelectric conversion region and has a sixth pattern.

According to at least one example embodiment, the sixth pattern has line symmetry in a first direction.

According to at least one example embodiment, the fourth pattern and the fifth pattern form a combination pattern that includes an interdigitated section where portions of the sixth wiring are interdigitated with portions of the fourth wiring and the fifth wiring.

According to at least one example embodiment, the interdigitated section has line symmetry in a first direction.

According to at least one example embodiment, the first pattern, the second pattern, and the third pattern have point symmetry with respect to a reference point.

According to at least one example embodiment, the imaging device includes a third wiring layer including a plurality of vertical signal lines that overlap the photoelectric conversion region.

According to at least one example embodiment, the imaging device includes a fourth wiring layer that includes a first gate wiring and a first gate pad electrically connected to a gate of the first transfer transistor and a gate of fifth transfer transistor of another pixel, and a second gate wiring and a second gate pad electrically connected to a gate of the second transfer transistor and a gate of a sixth transfer transistor of the another pixel.

According to at least one example embodiment, the imaging device includes a fifth wiring layer including a first contact strip electrically connected to the first gate pad, and a second contact strip electrically connected to the second gate pad.

According to at least one example embodiment, the first gate wiring, the first gate pad, and the first contact strip overlap the photoelectric conversion region.

At least one example embodiment is directed to a system including a light source, and an imaging device including a pixel. The pixel includes a photoelectric conversion region, a first transfer transistor coupled to the photoelectric conversion region to transfer charge generated by the photoelectric conversion region, a first floating diffusion coupled to the first transfer transistor, a second floating diffusion, a second transfer transistor coupled between the first floating diffusion and the second floating diffusion to control access to the second floating diffusion, a third transfer transistor coupled to the photoelectric conversion region to transfer charge generated by the photoelectric conversion region, a third floating diffusion coupled to the second transfer transistor, a fourth floating diffusion, and a fourth transfer transistor coupled between the third floating diffusion and the fourth floating diffusion to control access to the fourth floating diffusion. The imaging device includes a first wiring layer including a first wiring connected to the second floating diffusion, a second wiring connected to the fourth floating diffusion, and a third wiring connected to ground and capacitively coupled with the first wiring and the second wiring.

At least one example embodiment is directed to an imaging device including a pixel including a photoelectric conversion region, a first transfer transistor coupled to the photoelectric conversion region to transfer charge generated by the photoelectric conversion region, a first floating diffusion coupled to the first transfer transistor, a second floating diffusion, a second transfer transistor coupled between the first floating diffusion and the second floating diffusion to control access to the second floating diffusion, a third transfer transistor coupled to the photoelectric conversion region to transfer charge generated by the photoelectric conversion region, a third floating diffusion coupled to the second transfer transistor, a fourth floating diffusion, and a fourth transfer transistor coupled between the third floating diffusion and the fourth floating diffusion to control access to the fourth floating diffusion. The imaging device includes a first wiring layer including a first wiring connected to the second floating diffusion, a second wiring connected to the fourth floating diffusion, and a third wiring connected to ground and capacitively coupled with the first wiring and the second wiring. The first wiring, the second wiring, and the third wiring form a symmetrical pattern.

DETAILED DESCRIPTION

Figure 1:
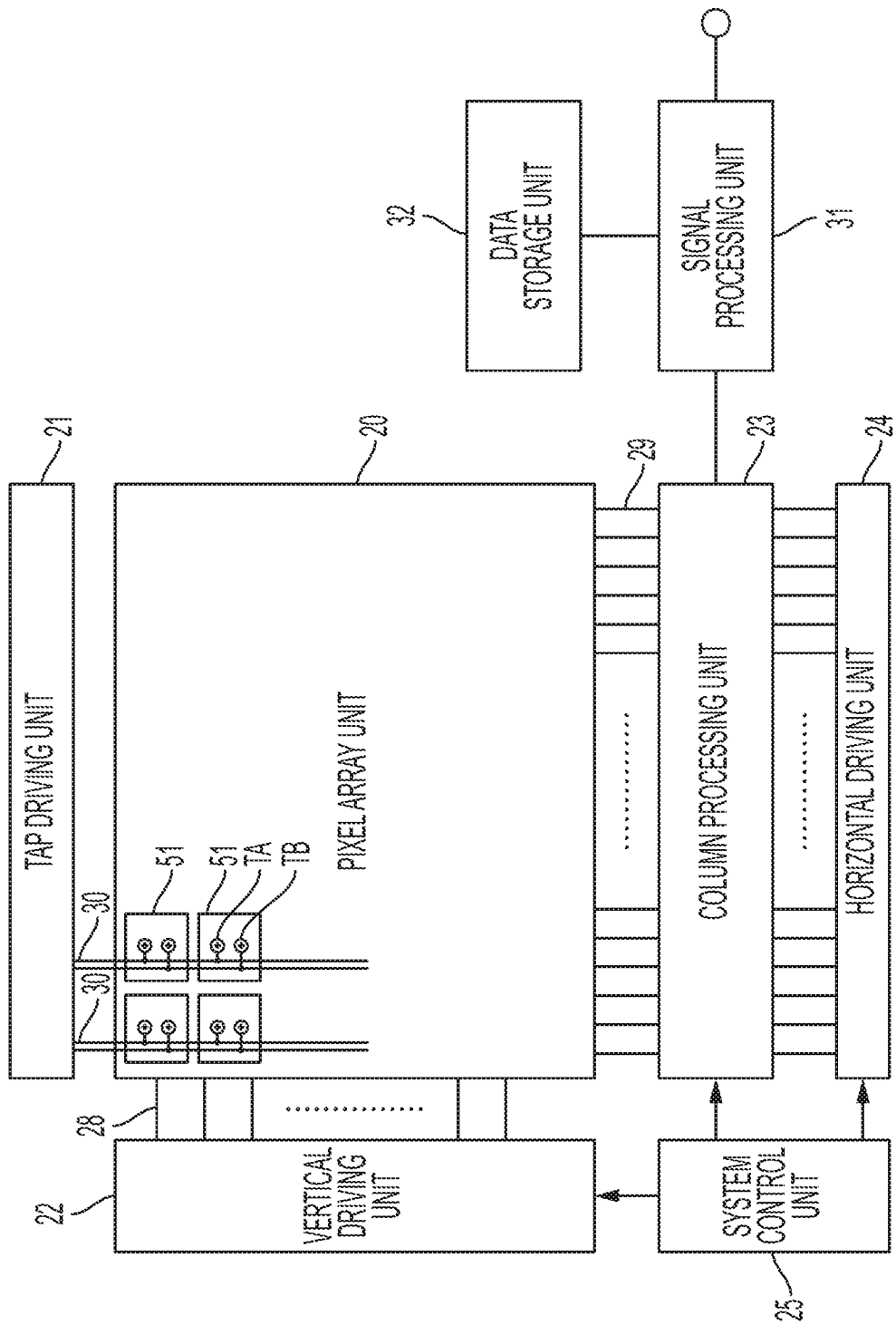
FIG. 1 is a block diagram of an imaging device according to at least one example embodiment.

FIG. 1 is a block diagram of an imaging device according to at least one example embodiment.

The pixel 51 includes a photoelectric conversion region PD, such as a photodiode or other light sensor, transfer transistors TG0 and TG1, floating diffusion regions FD0 and FD1, reset transistors RST0 and RST1, amplification transistors AMP0 and AMP1, and selection transistors SEL0 and SEL1.

The imaging device 1 shown in FIG. 1 may be an imaging sensor of a front or rear surface irradiation type, and is provided, for example, in an imaging apparatus having a ranging function (or distance measuring function).

The imaging device 1 has a pixel array unit (or pixel array or pixel section) 20 formed on a semiconductor substrate (not shown) and a peripheral circuit integrated on the same semiconductor substrate the same as the pixel array unit 20. The peripheral circuit includes, for example, a tap driving unit (or tap driver) 21, a vertical driving unit (or vertical driver) 22, a column processing unit (or column processing circuit) 23, a horizontal driving unit (or horizontal driver) 24, and a system control unit (or system controller) 25.

The imaging device element 1 is further provided with a signal processing unit (or signal processor) 31 and a data storage unit (or data storage or memory or computer readable storage medium) 32. Note that the signal processing unit 31 and the data storage unit 32 may be mounted on the same substrate as the imaging device 1 or may be disposed on a substrate separate from the imaging device 1 in the imaging apparatus.

The pixel array unit 20 has a configuration in which pixels 51 that generate charge corresponding to a received light amount and output a signal corresponding to the charge are two-dimensionally disposed in a matrix shape of a row direction and a column direction. That is, the pixel array unit 20 has a plurality of pixels 51 that perform photoelectric conversion on incident light and output a signal corresponding to charge obtained as a result. Here, the row direction refers to an arrangement direction of the pixels 51 in a horizontal direction, and the column direction refers to the arrangement direction of the pixels 51 in a vertical direction. The row direction is a horizontal direction in the figure, and the column direction is a vertical direction in the figure.

The pixel 51 receives light incident from the external environment, for example, infrared light, performs photoelectric conversion on the received light, and outputs a pixel signal according to charge obtained as a result. The pixel 51 may include a first charge collector that detects charge obtained by the photoelectric conversion PD by applying a predetermined voltage (first voltage) to the pixel 51, and a second charge collector that detects charge obtained by the photoelectric conversion by applying a predetermined voltage (second voltage) to the pixel 51. The first and second charge collector may include tap A and tap B, respectively. Although two charge collectors are shown (i.e., tap A, and tap B), more or fewer charge collectors may be included according to design preferences. The first voltage and the second voltage may be applied to respective areas of the pixel near tap A and tap B to assist with channeling charge toward tap A and tap B during different time periods. The charge is then read out of each tap A and B with transfer signals GD.

Although FIG. 1 illustrates two taps A/B, it should be appreciated that more or fewer taps and charge collectors may be included if desired, which may result in additional signal lines not shown in FIG. 1.

The tap driving unit 21 supplies the predetermined first voltage to the first charge collector of each of the pixels 51 of the pixel array unit 20 through a predetermined voltage supply line 30, and supplies the predetermined second voltage to the second charge collector thereof through the predetermined voltage supply line 30. Therefore, two voltage supply lines 30 including the voltage supply line 30 that transmits the first voltage and the voltage supply line 30 that transmits the second voltage are wired to one pixel column of the pixel array unit 20.

In the pixel array unit 20, with respect to the pixel array of the matrix shape, a pixel drive line 28 is wired along a row direction for each pixel row, and two vertical signal lines 29 are wired along a column direction for each pixel column. For example, the pixel drive line 28 transmits a drive signal for driving when reading a signal from the pixel. Note that, although FIG. 1 shows one wire for the pixel drive line 28, the pixel drive line 28 is not limited to one. One end of the pixel drive line 28 is connected to an output end corresponding to each row of the vertical driving unit 22.

The vertical driving unit 22 includes a shift register, an address decoder, or the like. The vertical driving unit 22 drives each pixel of all pixels of the pixel array unit 20 at the same time, or in row units, or the like. That is, the vertical driving unit 22 includes a driving unit that controls operation of each pixel of the pixel array unit 20, together with the system control unit 25 that controls the vertical driving unit 22.

The signals output from each pixel 51 of a pixel row in response to drive control by the vertical driving unit 22 are input to the column processing unit 23 through the vertical signal line 29. The column processing unit 23 performs a predetermined signal process on the pixel signal output from each pixel 51 through the vertical signal line 29 and temporarily holds the pixel signal after the signal process.

Specifically, the column processing unit 23 performs a noise removal process, a sample and hold (S/H) process, an analog to digital (AD) conversion process, and the like as the signal process.

The horizontal driving unit 24 includes a shift register, an address decoder, or the like, and sequentially selects unit circuits corresponding to pixel columns of the column processing unit 23. The column processing unit 23 sequentially outputs the pixel signals obtained through the signal process for each unit circuit, by a selective scan by the horizontal driving unit 24.

The system control unit 25 includes a timing generator or the like that generates various timing signals and performs drive control on the tap driving unit 21, the vertical driving unit 22, the column processing unit 23, the horizontal driving unit 24, and the like, on the basis of the various generated timing signals.

The signal processing unit 31 has at least a calculation process function and performs various signal processing such as a calculation process on the basis of the pixel signal output from the column processing unit 23. The data storage unit 32 temporarily stores data necessary for the signal processing in the signal processing unit 31. The signal processing unit 31 may control overall functions of the imaging device 1. For example, the tap driving unit 21, the vertical driving unit 22, the column processing unit 23, the horizontal driving unit 24, and the system control unit 25, and the data storage unit 32 may be under control of the signal processing unit 31. The signal processing unit or signal processor 31, alone or in conjunction with the other elements of FIG. 1, may control all operations of the systems discussed in more detail below with reference to the accompanying figures. Thus, the terms "signal processing unit" and "signal processor" may also refer to a collection of elements 21, 22, 23, 24, 25, and/or 31. A signal processor according to at least one example embodiment is capable of processing color information to produce a color information and depth information to produce a depth image.

Figure 2:
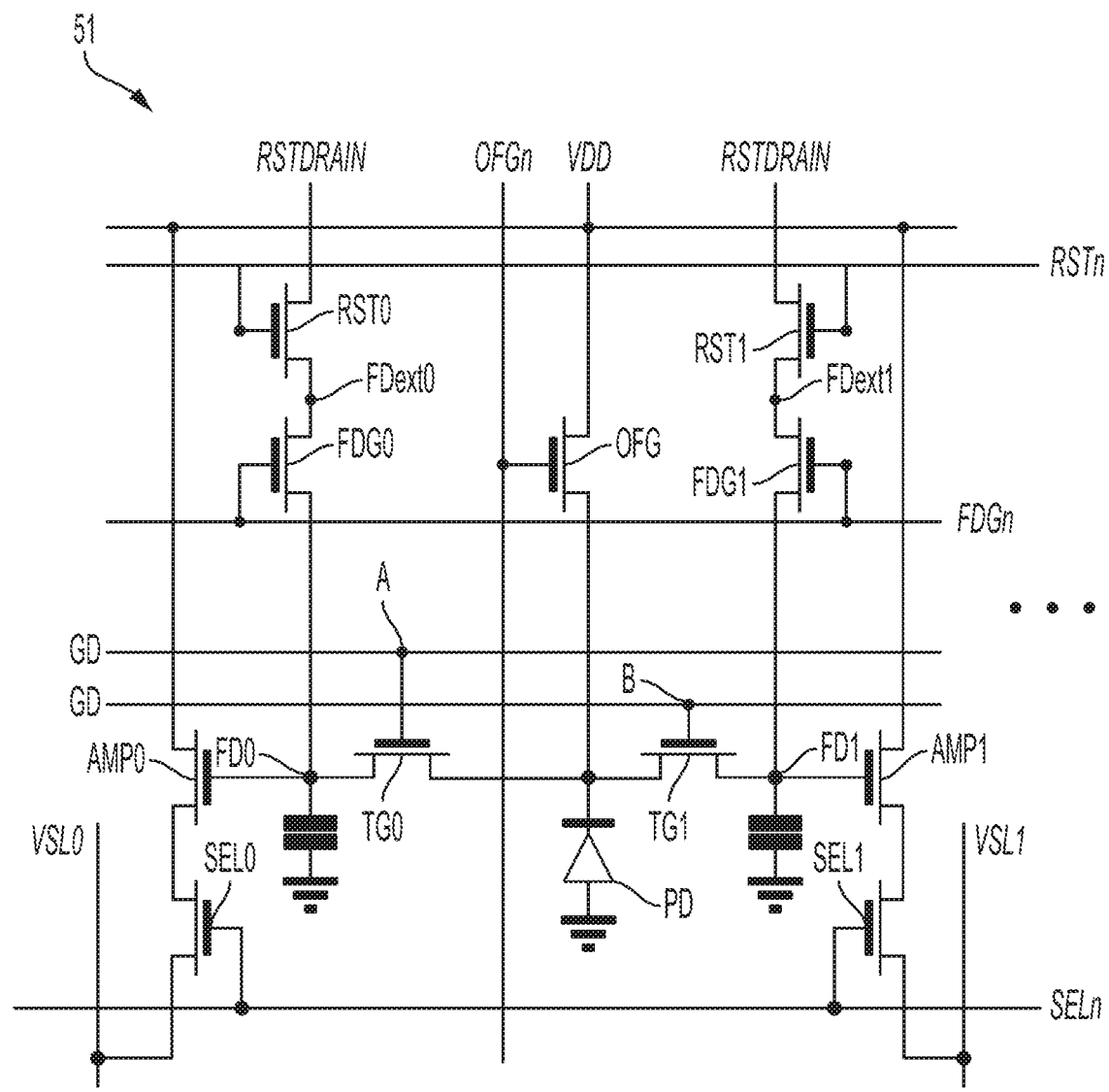
FIG. 2 illustrates an example schematic of a pixel from FIG. 1.

FIG. 2 illustrates an example schematic of a pixel 51 from FIG. 1. The pixel 51 includes a photoelectric conversion region PD, such as a photodiode or other light sensor, transfer transistors TG0 and TG1, floating diffusion regions FD0 and FD1, reset transistors RST0 and RST1, amplification transistors AMP0 and AMP1, and selection transistors SEL0 and SEL1. The pixel 51 may further include an overflow transistor OFG, transfer transistors FDG0 and FDG1, and floating diffusion regions FD0ext and FD1ext.

The pixel 51 may be driven according to control signals or transfer signals GD applied to gates or taps A/B of transfer transistors TG0/TG1, reset signal RSTDRAIN, overflow signal OFGn, power supply signal VDD, selection signal SELn, and vertical selection signals VSL0 and VSL1. These signals are provided by various elements from FIG. 1, for example, the tap driver 21, vertical driver 22, system controller 25, etc.

As shown in FIG. 2, the transfer transistors TG0 and TG1 are coupled to the photoelectric conversion region PD and have taps A/B that transfer charge as a result of applying transfer signals.

These transfer signals GD may have different phases relative to a phase of a modulated signal from a light source (e.g., phases that differ 0 degrees, 90 degrees, 180 degrees, and/or 270 degrees, or alternatively, phases that differ by 120 degrees). The transfer signals may be applied in a manner that allows for depth information (or pixel values) to be captured in a desired number of frames (e.g., one frame, two frames, four frames, etc.). One of ordinary skill in the art would understand how to apply the transfer signals in order to use the collected charge to calculate a distance to an object. In at least one example embodiment, other transfer signals may be applied in a manner that allows for color information to be captured for a color image.

It should be appreciated that the transfer transistors FDG0/FDG1 and floating diffusions (or floating diffusion extensions) FD0ext/FD1ext are included to expand the charge capacity of the pixel 51, if desired. However, these elements may be omitted or not used, if desired. The overflow transistor OFG is included to transfer overflow charge from the photoelectric conversion region PD, but may be omitted or unused if desired. Further still, if only one tap is desired, then elements associated with the other tap may be unused or omitted (e.g., TG1, FD1, FDG1, RST1, SEL1, AMP1).

Here, it should be appreciated that the pixel 51 includes identical sets of pixel elements that may be further replicated for each pixel 51 if desired. For example, elements TG0, FD0, FDG0, FD0ext, RST0, SEL0, AMP0, VSL0 are considered as a first set of pixel elements, while TG1, FD1, FDG1, FD1ext, RST1, SEL1, AMP1, and VSL1 are a second set of pixel elements that have the same structures, connections to one another, and functions as those in the first set of pixel elements. N sets of pixel elements TGn, FDn, FDnext, FDGn, RSTn, SELn, AMPn, and VSLn may be included as indicated by the ellipsis in FIG. 2.

Example embodiments will now be described with reference to FIGS. 3-33, which relate to pixel layouts and driving methods thereof that may reduce a footprint of a pixel, allow for substantially same charge transfer times for transfer transistors, provide improved depth sensing performance in bright ambient light conditions, improve conversion gain, and/or provide various operational modes, among other advantages. Throughout the instant description, where reference to general element or set of elements is appropriate instead of a specific element, the description may refer to the element or set of elements by its root term. For example, when reference to a specific transfer transistor TG0 or TG1 is not necessary, the description may refer to the transfer transistor(s) "TG." In addition, FIGS. 3-33 generally show various embodiments for wirings layers within a pixel 51 that adhere to the schematic shown in FIG. 2. However, in FIGS. 3-33, various elements from FIG. 2 and electrical connections therebetween may be obscured or not shown for the sake of clearer illustration of wiring layers and/or contacts/electrodes, but should be understood to exist in a manner consistent with the knowledge of one of ordinary skill in the art. For example, the figures generally show details of different wirings layers (M1, M2, etc.), which sometimes illustrate wirings that appear to have no connection to another wiring or element within a pixel. However, it should be appreciated that such connections may occur in one or more other wiring layers not shown because the details of these connections are not necessary for the understanding of inventive concepts.

It should be further understood that FIGS. 3-33 show substantially accurate relative positional relationships of the elements depicted therein and can be relied upon as support for such positional relationships. For example, the figures provide support for selection transistors SEL and amplification transistors AMP being aligned with one another in a particular direction (e.g., horizontal direction), while transistors FDG and RST are sometimes depicted as being aligned with one another in the vertical direction. As another example, the figures provide support for a transistor on a right side of a figure being aligned with a transistor on a left side of a figure in the horizontal direction. These and other positional relationships, such as overlapping relationships between elements, may be deduced from the figures.

Figure 3:
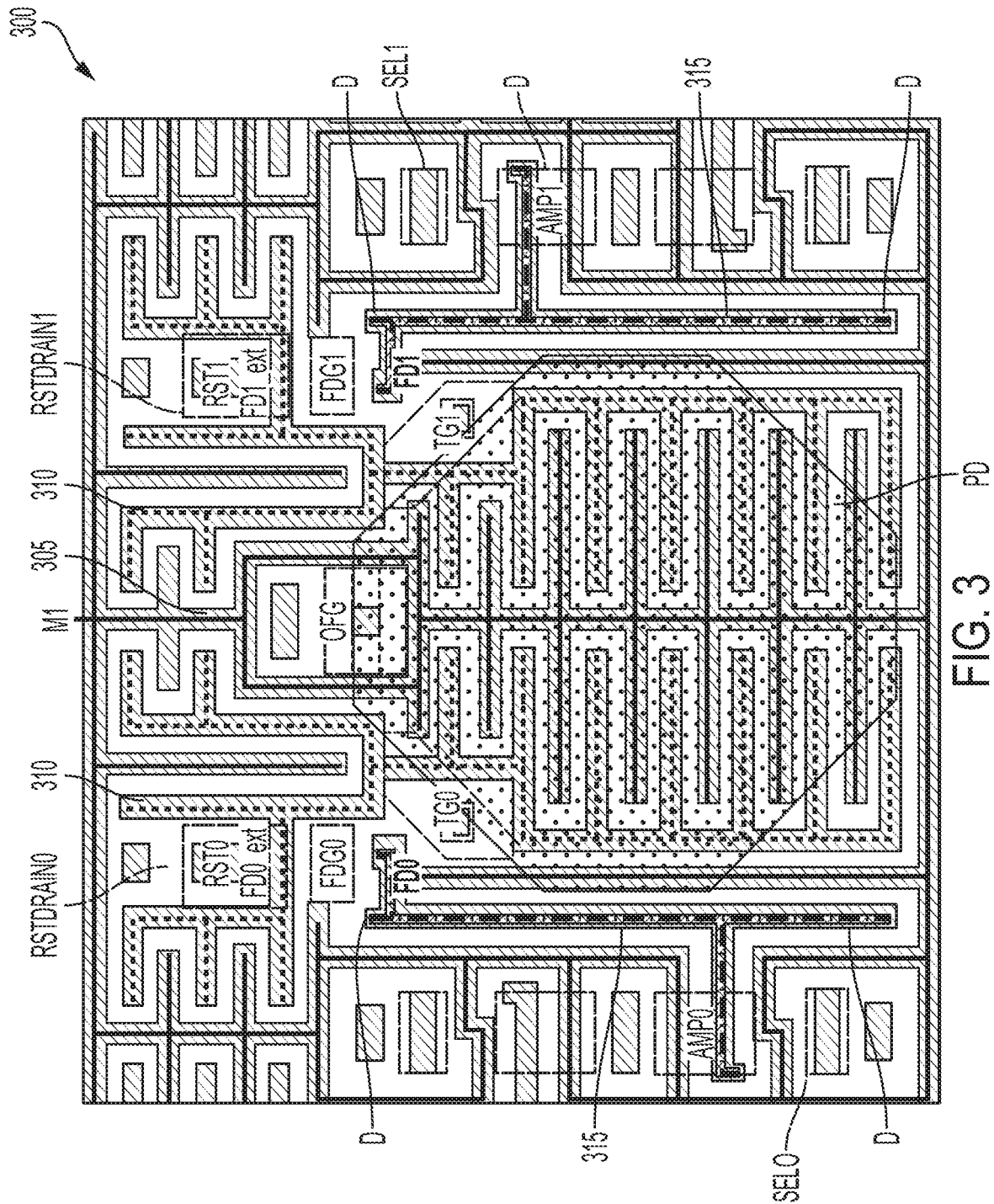
FIG. 3 illustrates a layout for wirings in a wiring layer of a pixel according to at least one example embodiment.
Figure 4:
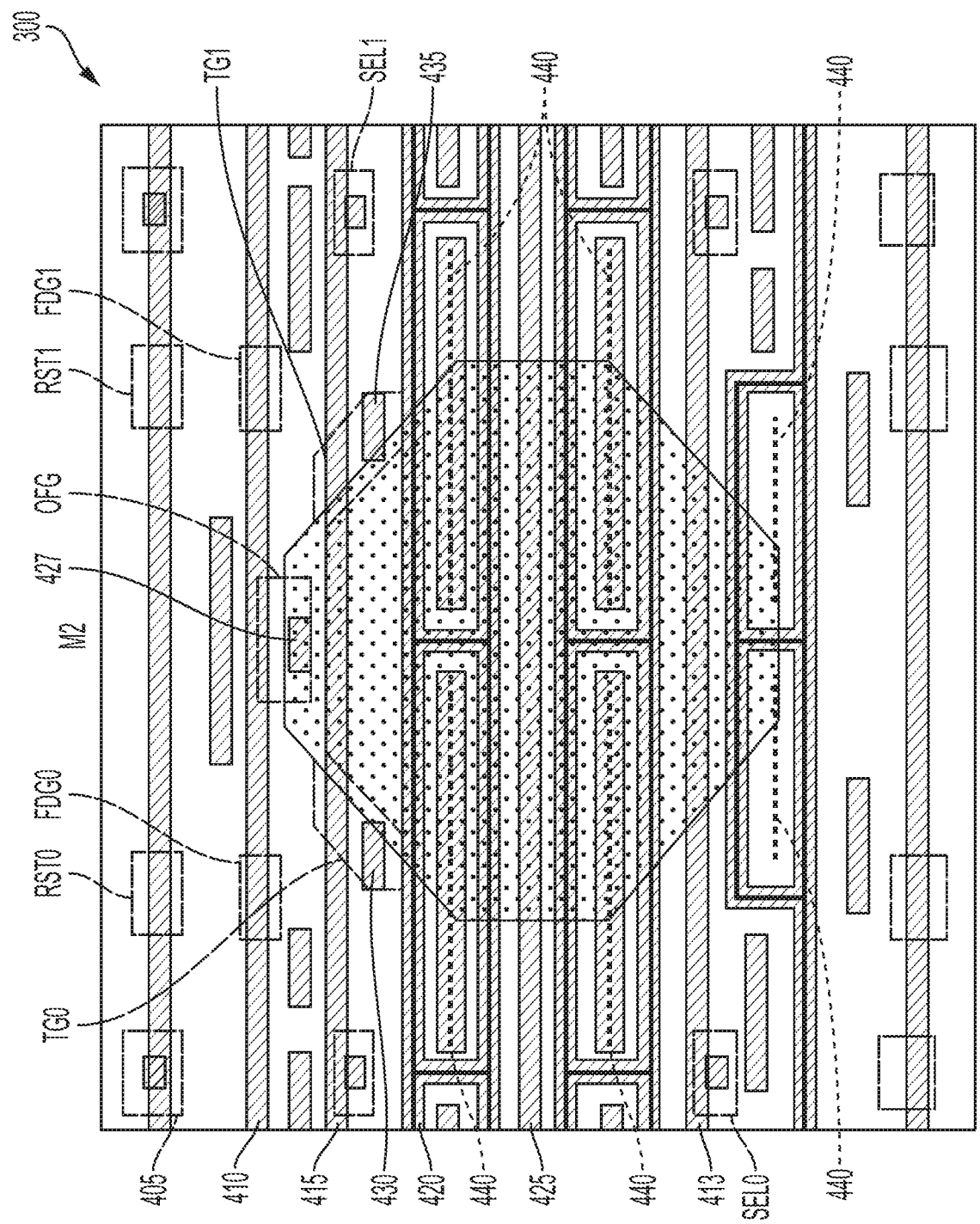
FIG. 4 illustrates a layout for wirings in another wiring layer of the pixel in FIG. 3 according to at least one example embodiment.

FIGS. 3 and 4 illustrate inventive concepts according to at least one example embodiment.

In more detail, FIGS. 3 and 4 illustrate example pixel layouts 300 and 400 for a pixel 51.

FIG. 3 illustrates a pixel layout 300 having a photoelectric conversion region PD (octagonal shape), transfer transistors TG0-TG1, overflow gate (or transistors) OFG, reset transistors RST0/RST1, floating diffusions FD0/FD1 and FD0ext/FD1ext, floating diffusion transistors FDG0/FDG1, amplification transistors AMP0/AMP1, and selection transistors SEL0/SEL1. The transistor OFG may be a transistor that provides for overflow of electric charge in bright ambient light conditions so that the ambient light has a reduced effect on the charge of interest collected by the FDs. In operation, it should be appreciated that different transfer signals may be applied to transfer transistors TG0 and TG1 to collect electric charge at different times to enable depth measurements. For example, the transfer signals applied to TG0 and TG1 may have phases that are chosen in relation to a reference optical signal that is emitted toward an object and reflected back from the object to the photoelectric conversion regions. A distance to an object may be calculated according to known methods. One such method is set forth below with Equation (1):

$$\text{Distance} = \frac{C \cdot \Delta T}{2} = \frac{C \cdot \alpha}{4\pi f_{mod}} \quad (1)$$

$$\alpha = \arctan\left(\frac{\phi_1 - \phi_3}{\phi_0 - \phi_2}\right)$$

Here, C is the speed of light, $\Delta T$ is the time delay, fmod is the modulation frequency of the emitted light or reference optical signal, $\varphi 0$ to $\varphi 3$ are the signal values detected with transfer signals having phase differences from the emitted light 0 degrees, 90 degrees, 180 degrees, and 270 degrees, respectively.

With reference to FIG. 3, enabling a high conversion gain mode employs floating diffusions FD0 and FD1 while enabling a low conversion gain mode employs floating diffusions FD0, FD1, FD0ext, and FD1ext. These modes enable improved low-light performance and/or improved dynamic range.

FIG. 3 further shows a wiring layer M1 including wirings 305, 310, and 315 for capacitance matching between various elements of the pixel 51. Here, the wirings 310 may be coupled to FD0ext and/or FD1ext, the wiring 305 may be coupled to ground (or a common voltage), and the wirings 315 may couple the floating diffusions FDs to respective amplification transistors AMPs for transferring charge from a floating diffusion FD to an amplification transistor AMP (e.g., FD0 to AMP0, and FD1 to AMP 1).

As shown, the wirings 305 and 310 may be a plurality of finger wirings that form a series of interdigitated patterns in order to match a capacitance of floating diffusion FD0ext to floating diffusion FD1ext. As shown in FIG. 3, there are two patterns of wirings 310, one pattern connected to floating diffusion FD0ext and one pattern connected to floating diffusion FD1ext. The goal here is to maintain a high fill-factor (FF) while optimizing the low conversion gain mode by reducing the effect of the mismatched capacitances of floating diffusion FDext0 and floating diffusion FDext1.

In addition, capacitances of floating diffusions FD0/FD1 are dependent on wirings 315 that connect a floating diffusion FD to an amplification transistor AMP relative to unillustrated wirings connected to TG0/TG1, which may have an effect on signal transfer. Thus, capacitances of floating diffusions FD0 and FD1 are matched by adding dummy extensions D to one or both the connections between a respective floating diffusion FD and a respective amplification transistor AMP. A dummy extension for wirings 315 may be any part of the wiring that is not needed to make electrical connection between a floating diffusion FD and an amplification transistor AMP. For example, dummy extensions D of wirings 315 that are extend past an amplification transistor AMP are not used for making electrical connection but are included to match capacitances of each floating diffusion FD0 and FD1.

In any event, the wirings 305/310/315 are formed in patterns such that a coupling mismatch in both high and low conversion gain modes may be less than, for example, 0.1%. However, example embodiments are not limited thereto, and the percentage of coupling mismatch may be controlled to be within a desired percentage that is based on design preferences.

FIG. 4 illustrates 300 the layout of FIG. 3 in more detail, for example, by illustrating another wiring layer M2 that is over or under wiring layer M1. FIG. 4 illustrates M2 level wirings 405, 410, 415, 427, 430, and 435 for transistors RST, FDG, SEL, and TG. For example, wiring 405 carries reset signals to reset transistors RST0/RST1, wiring 410 caries transfer signals to transistors FDG0/FDG1, wiring 413 carries a selection signal to selection transistor SEL0 wiring, wiring 415 carries a selection signal to selection transistor SEL1, 427 carrying transfer signals to transistor OFG, wiring 430 carries transfer signals to transfer transistor TG0, and wiring 435 carries transfer signals to transfer transistor TG1. FIG. 4 further illustrates wirings 420, which are connected to ground VSS (or a common voltage) similar to wiring 305 in FIG. 3, and wirings 425 that are connected to a power source VDD and that make connection to drains of amplification transistors AMP. FIG. 4 further includes wirings 440 that connect to floating diffusions FD0ext and FD1ext similar to wirings 310 in FIG. 3. In general, a wiring 440 on a left side of the figure connect to floating diffusion FD0_ext, and a wiring 440 a right side of the figure connects to floating diffusion FD1_ext. The same is true for the description of all figures including an element 440. Here, it should be appreciated that floating diffusion FD and FDext wirings 310 may be shielded (e.g., surrounded by at least 70% or other desired percentage) by wirings 420 (shown and not shown) from signals carried by other signal lines in FIG. 4.

With reference to FIGS. 3 and 4, it should be appreciated that the wirings in each figure may be formed so as to create symmetry along at least one line. For example, the wirings 305/310/315 and 420/440 may be symmetrical along a vertical axis and/or along a horizontal axis that passes through a center of the pixel 51 (which may also be a center of the photoelectric conversion region PD). In the layout of FIGS. 3 and 4 amplification transistors AMP0 and AMP1 may each share drain regions with an amplification transistor of a neighboring pixel (not shown).

It should further be appreciated that wirings 305 and 310, and 420 and 440 form a capacitive structure that may assist with increasing an amount of charge capable of being stored by the pixel.

Figure 5:
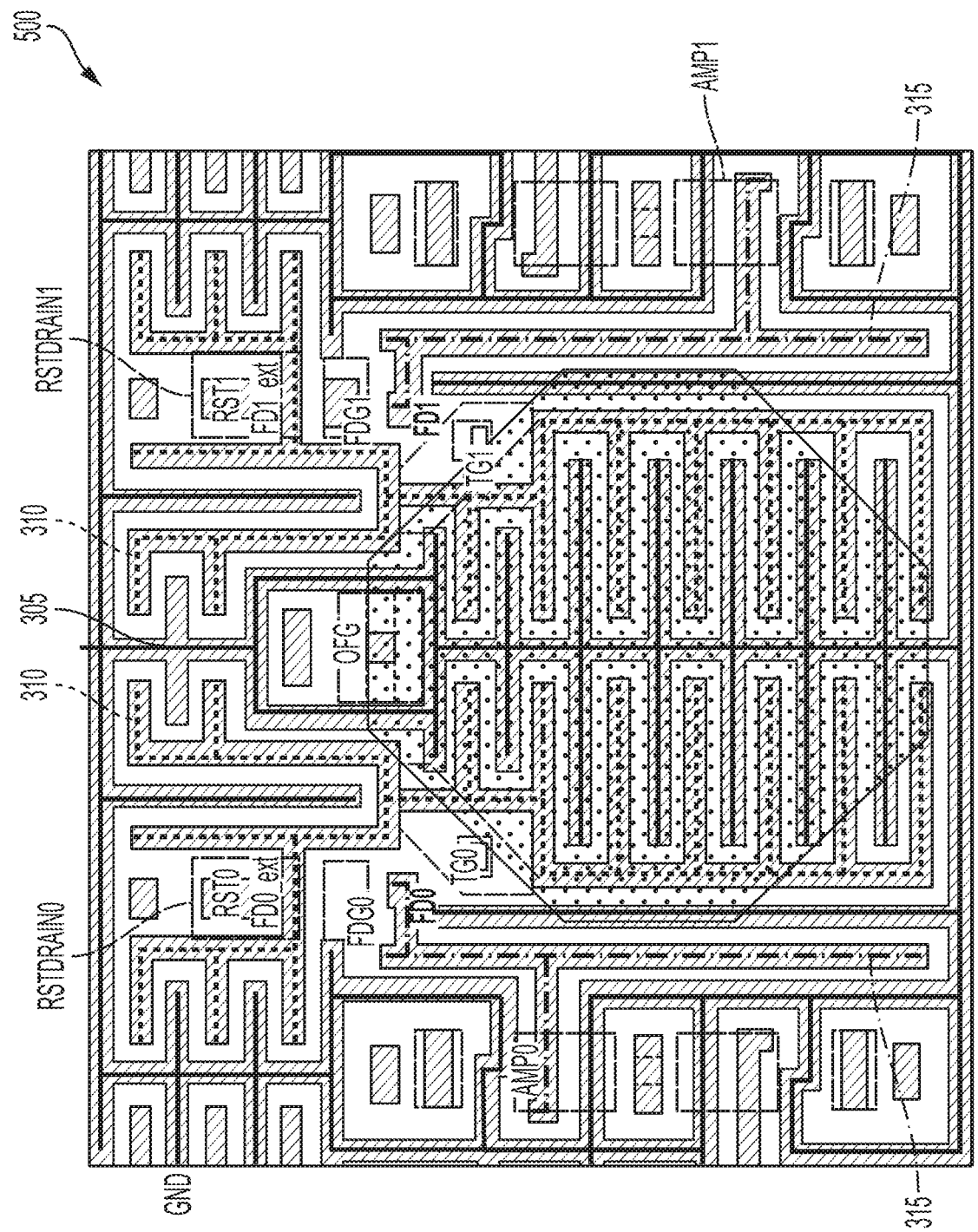
FIG. 5 illustrates a layout for wirings that is a variation of the layout shown in FIG. 3 according to at least one example embodiment.

FIG. 5 illustrates a layout 500 that is a variation of the layout 300 shown in FIG. 3. For example, FIG. 5 shows different connections for respective floating diffusions FDs to amplification transistors AMPs compared to FIG. 3.

Figure 6:
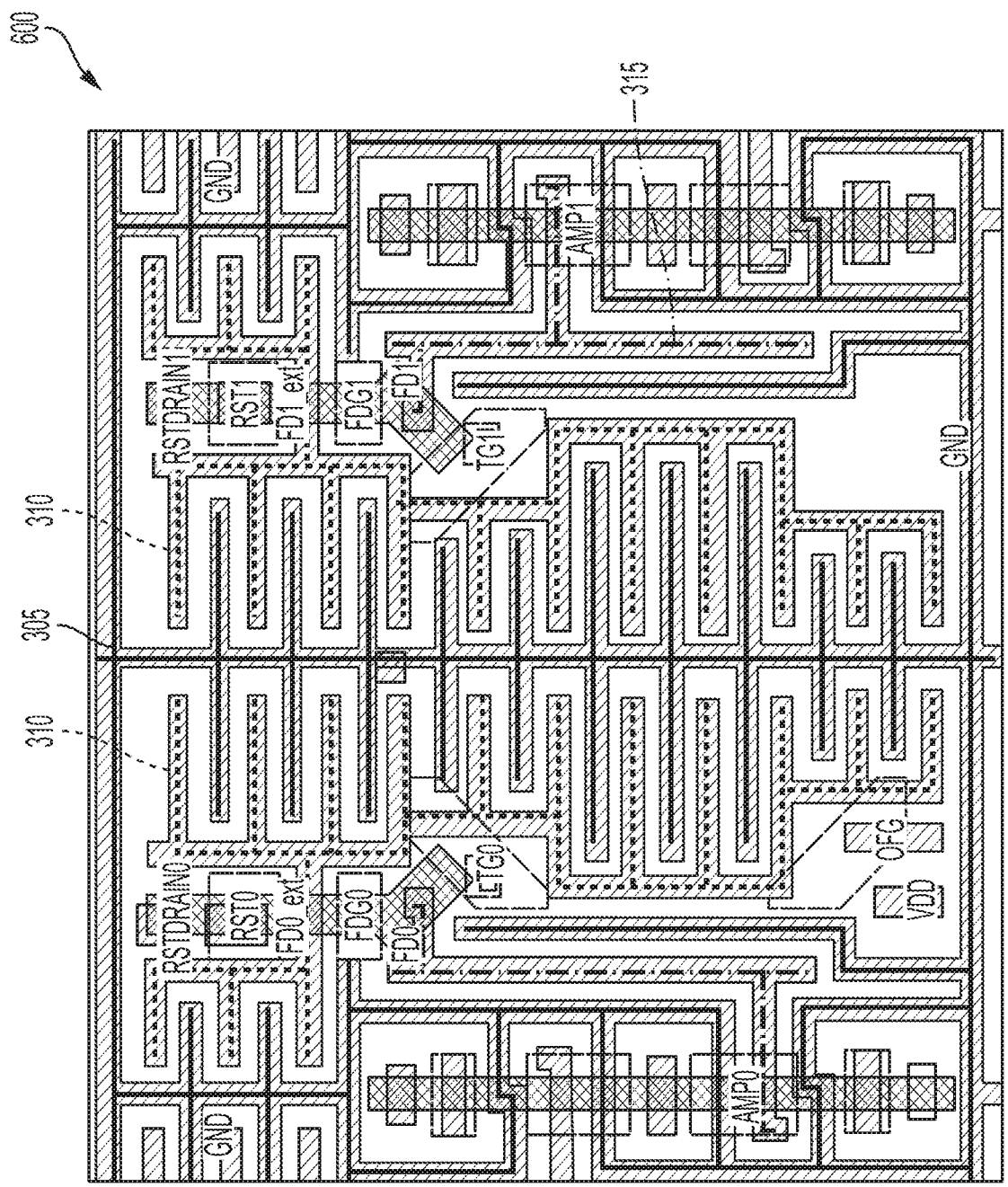
FIG. 6 illustrates a layout for wirings in a wiring layer of a pixel according to at least one example embodiment.
Figure 7:
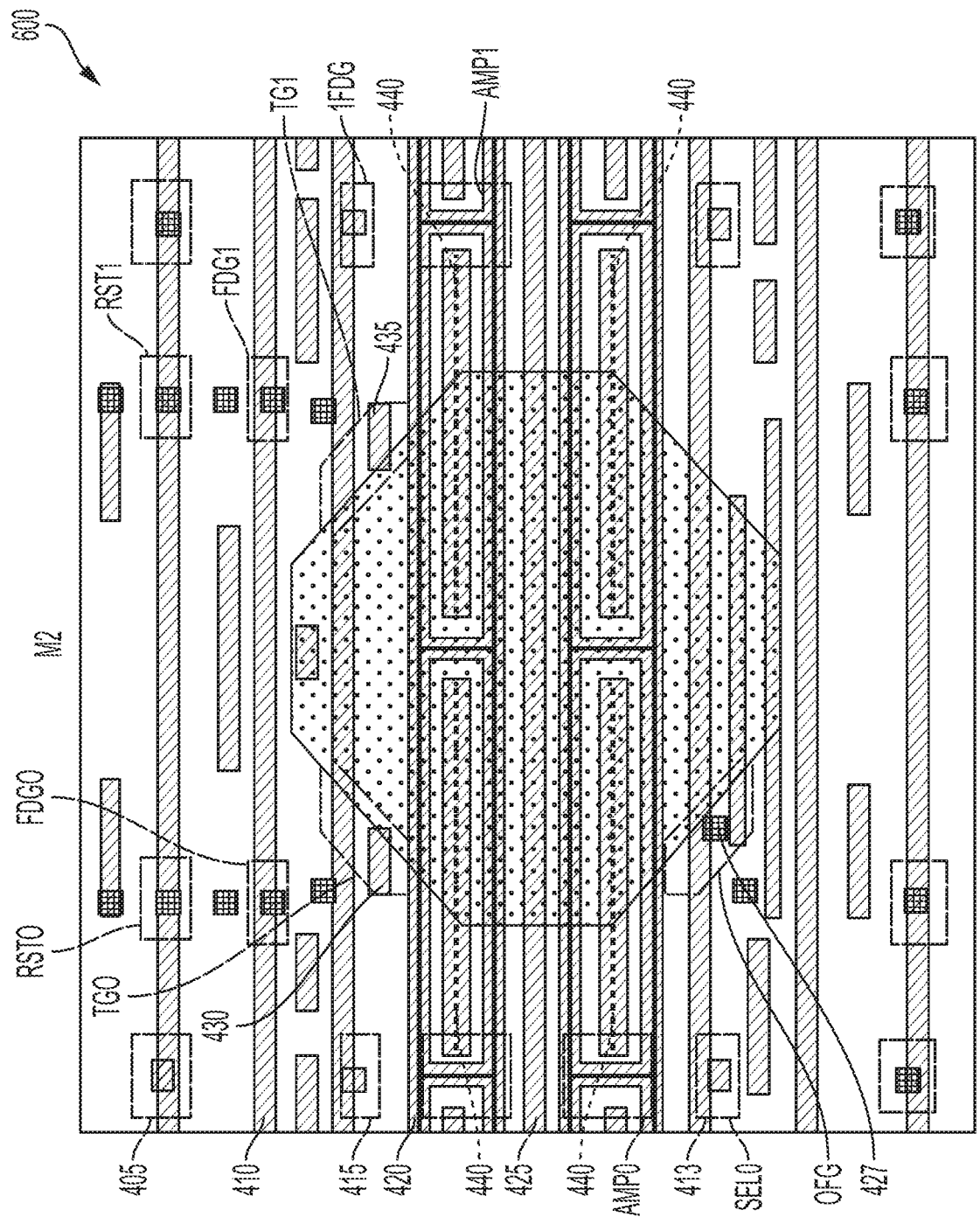
FIG. 7 illustrates a layout for wirings in another wiring layer of the pixel in FIG. 3 according to at least one example embodiment.

FIGS. 6 and 7 illustrate a pixel layout 600 according to at least one example embodiment. FIGS. 6 and 7 differ from FIGS. 3-5 regarding a location of transistor OFG as well as a pattern of at least some of the wirings 310, wirings 305, and wirings 315 (blue). FIG. 6 illustrates these wirings in an M1 layer of the pixel 51 while FIG. 7 illustrates an M2 layer of the pixel 51. FIG. 7 includes the same wirings as FIG. 4, and thus a description thereof will not be repeated. As in FIGS. 3 and 4, the wirings 305/310/315 and 420/440 in FIGS. 6 and 7 may be symmetrical along a vertical axis and/or along a horizontal axis that passes through a center of the pixel 51 (which may also be a center of the photoelectric conversion region PD). In the layout of FIGS. 6 and 7 amplification transistors AMP0 and AMP1 may each share drain regions with an amplification transistor of a neighboring pixel (not shown).

Figure 8:
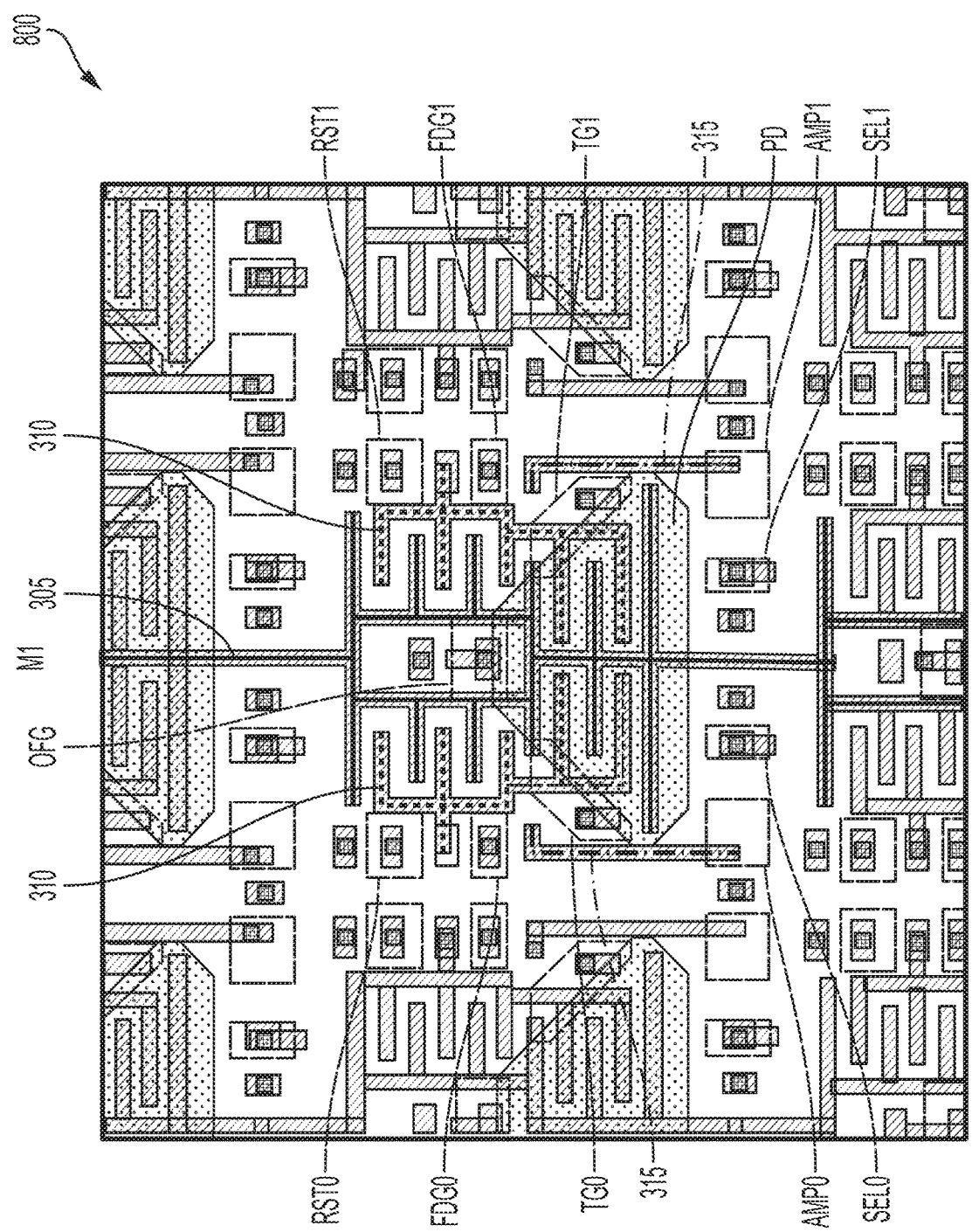
FIG. 8 illustrates a layout for wirings in a wiring layer of a pixel according to at least one example embodiment.
Figure 9:
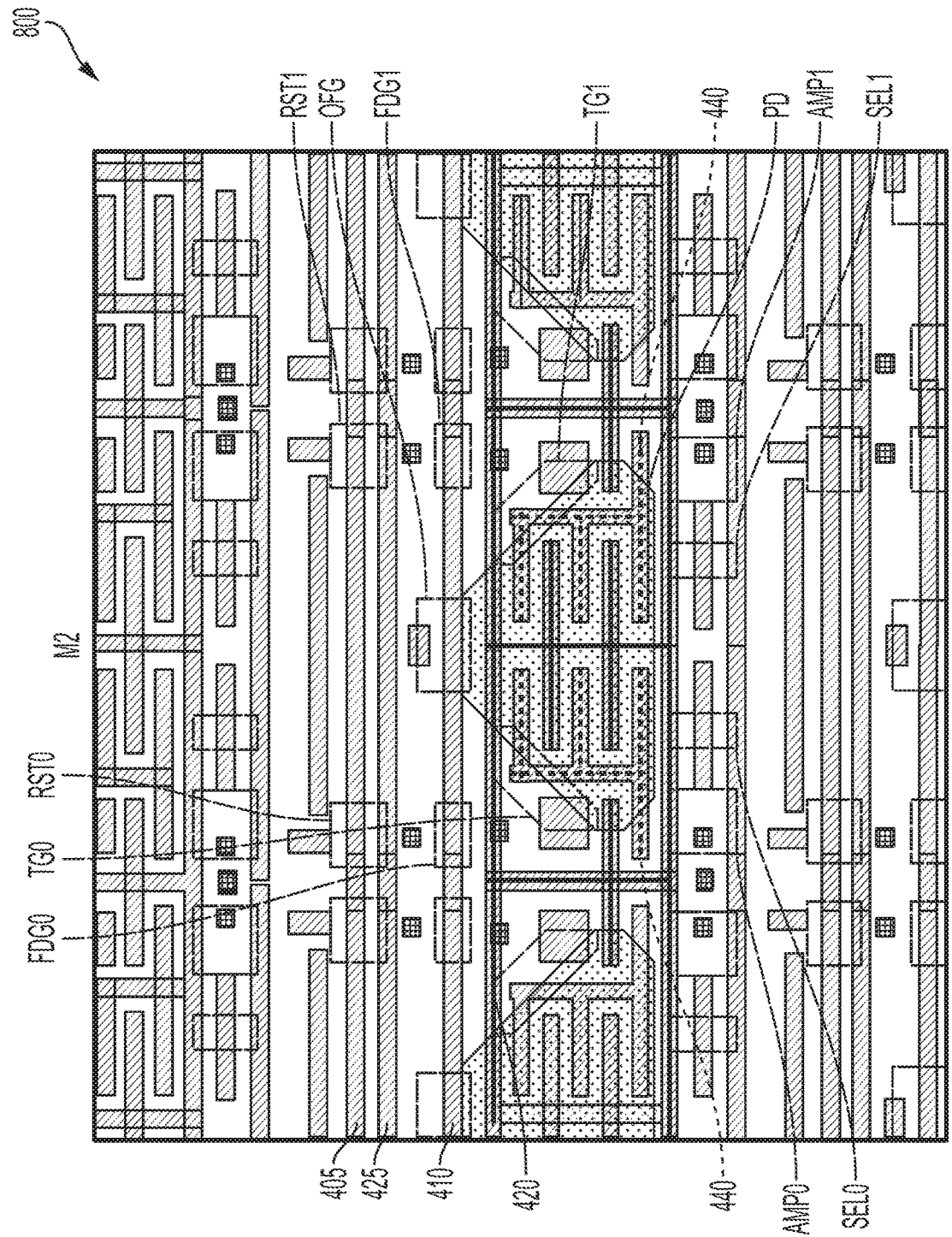
FIG. 9 illustrates a layout for wirings in another wiring layer of the pixel in FIG. 8 according to at least one example embodiment.

FIGS. 8 and 9 illustrate a pixel layout 800 according to at least one example embodiment. In FIGS. 8 and 9, a layout 800 of the photoelectric conversion region PD and associated transistors is different than in FIGS. 3-7. As in FIGS. 3-7, FIGS. 8 and 9 illustrate patterns for the FDext wirings (yellow), GND wirings (red), and FD to AMP wirings (blue). FIG. 8 illustrates these wirings in an M1 layer of the pixel 51 while FIG. 9 illustrates an M2 layer of the pixel. FIG. 9 further illustrates some of the same wirings from FIG. 4 to carry signals to various transistors. As in previous figures, the wirings 305/310/315 and 420/440 in FIGS. 8 and 9 may be symmetrical along a vertical axis and/or along a horizontal axis that passes through a center of the pixel 51 (which may also be a center of the photoelectric conversion region PD). In the layout of FIGS. 8 and 9 amplification transistors AMP0 and AMP1 may each share drain regions with an amplification transistor of a neighboring pixel.

Figure 10:
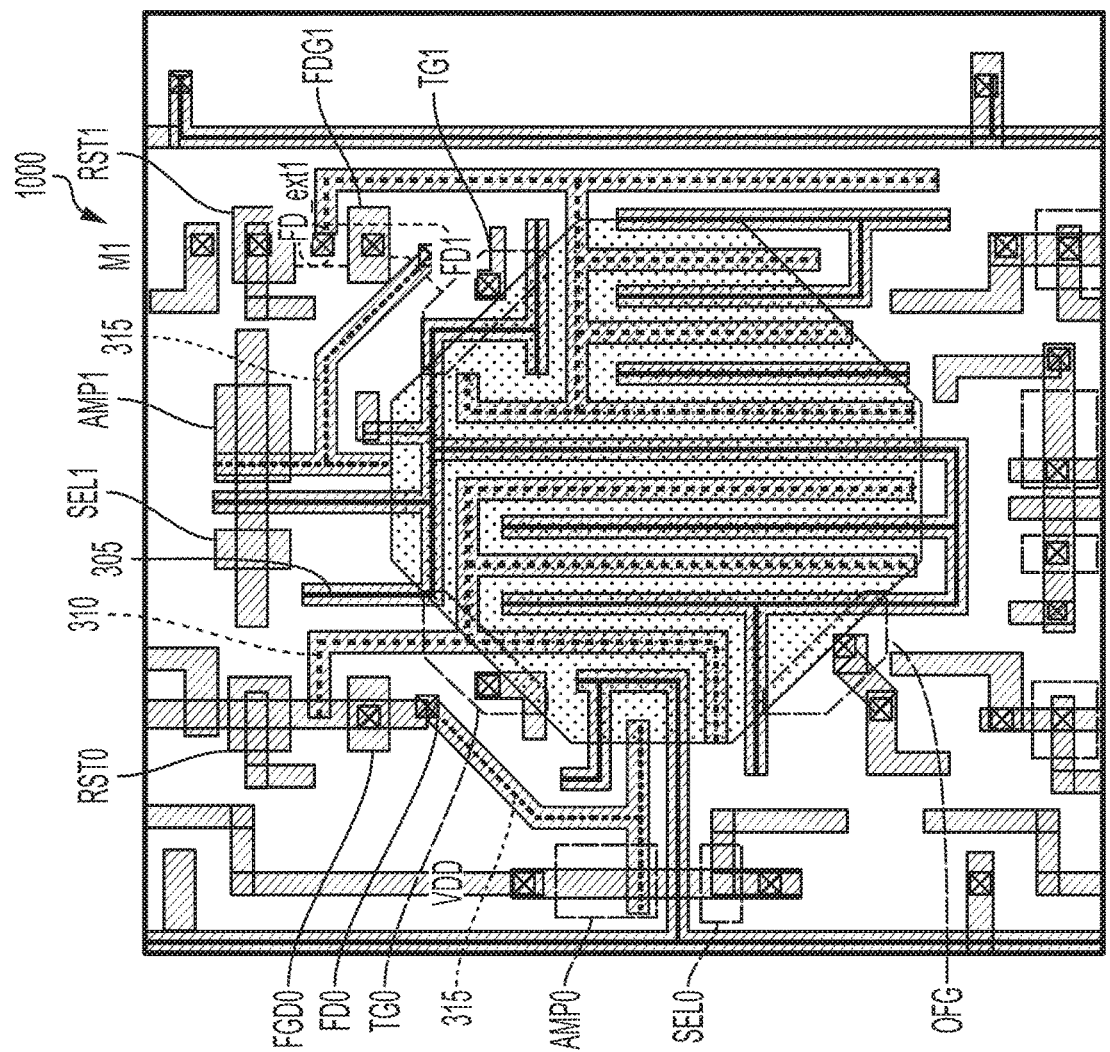
FIG. 10 illustrates a layout for wirings in a wiring layer of a pixel according to at least one example embodiment.
Figure 11:
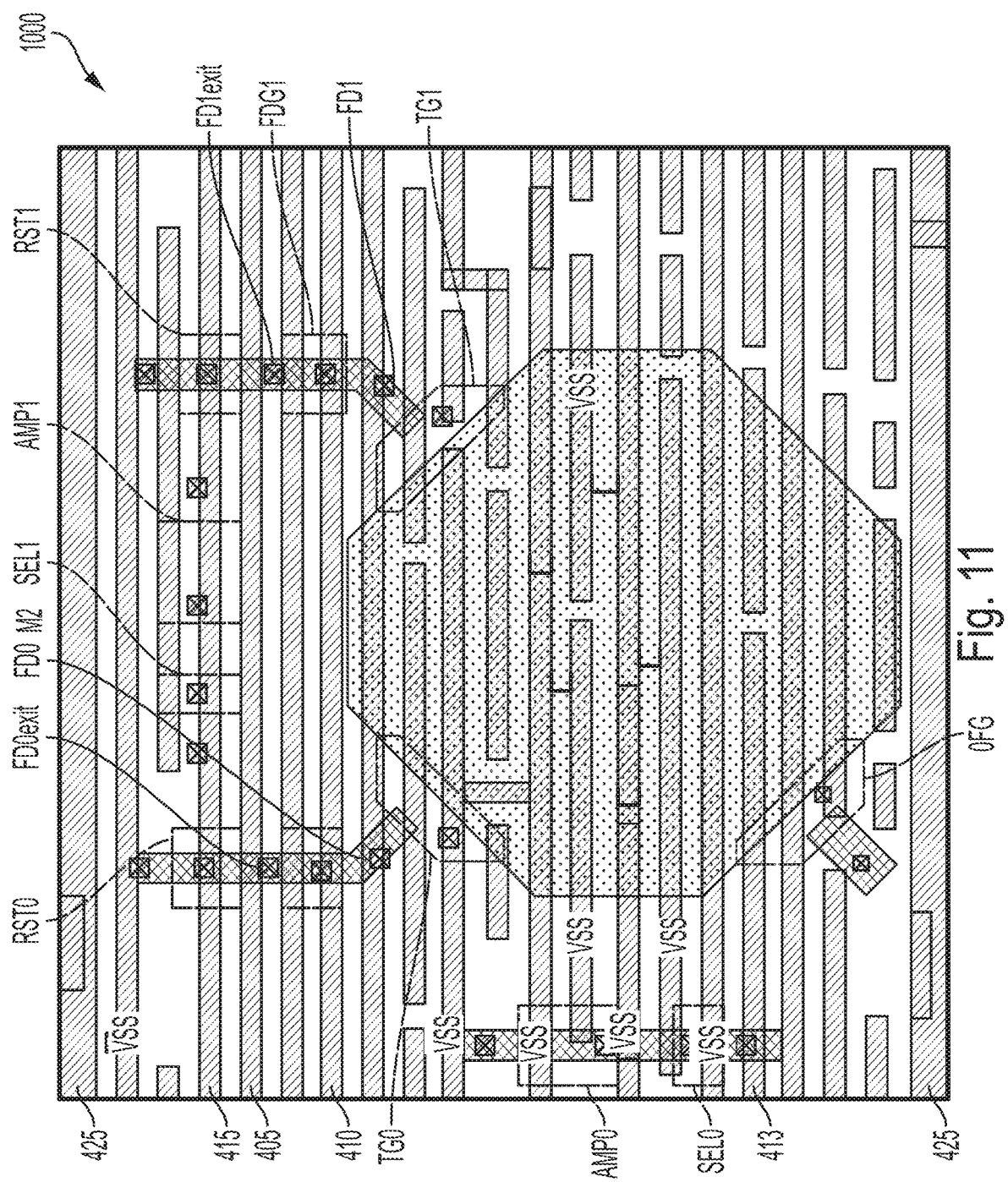
FIG. 11 illustrates a layout for wirings in another wiring layer of the pixel in FIG. 10 according to at least one example embodiment.

FIGS. 10 and 11 illustrate additional examples of a pixel layout 1000 according to at least one example embodiment. FIG. 10 illustrates an M1 level for wirings 305, 310, and 315 as well as different layout for transistors of the pixel 51, and FIG. 11 illustrates an M2 level of wirings. In FIG. 10, the wirings 305/310/315 in are generally asymmetrical. FIG. 11 further illustrates some of the same wirings from FIG. 4 to carry signals to various transistors, and a plurality of VSS or ground wirings (some labeled and some not labeled) that are designed to shield some desired percentage of the wirings 310 in FIG. 10.

Figure 12:
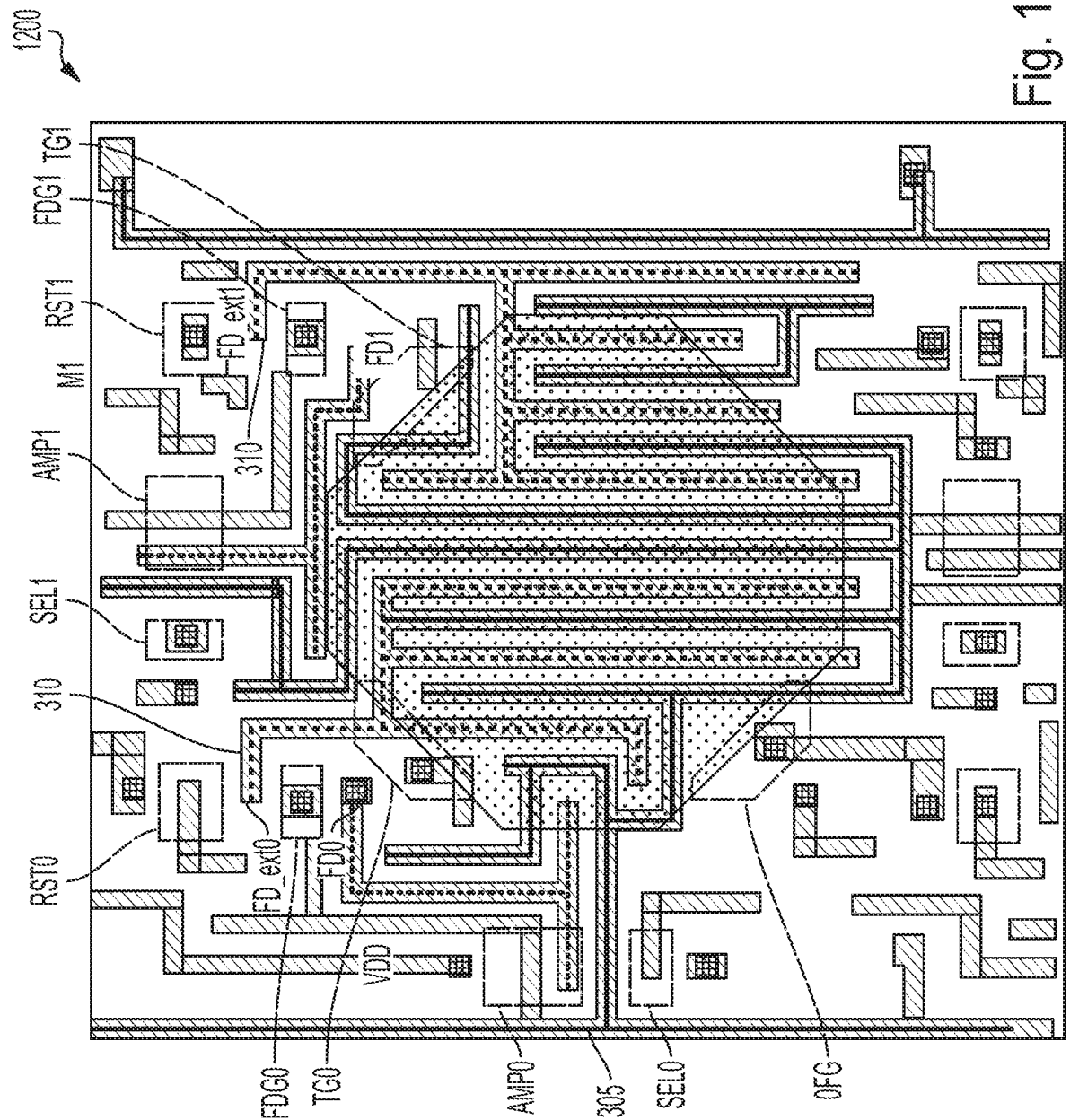
FIG. 12 illustrates a layout that is a further variation for the wirings in a wiring layer of the pixel shown in FIG. 10.

FIG. 12 illustrates a layout 1200 that is a further variation for the wirings 305/310/315 of the pixel 51 shown in FIG. 10.

Figure 13:
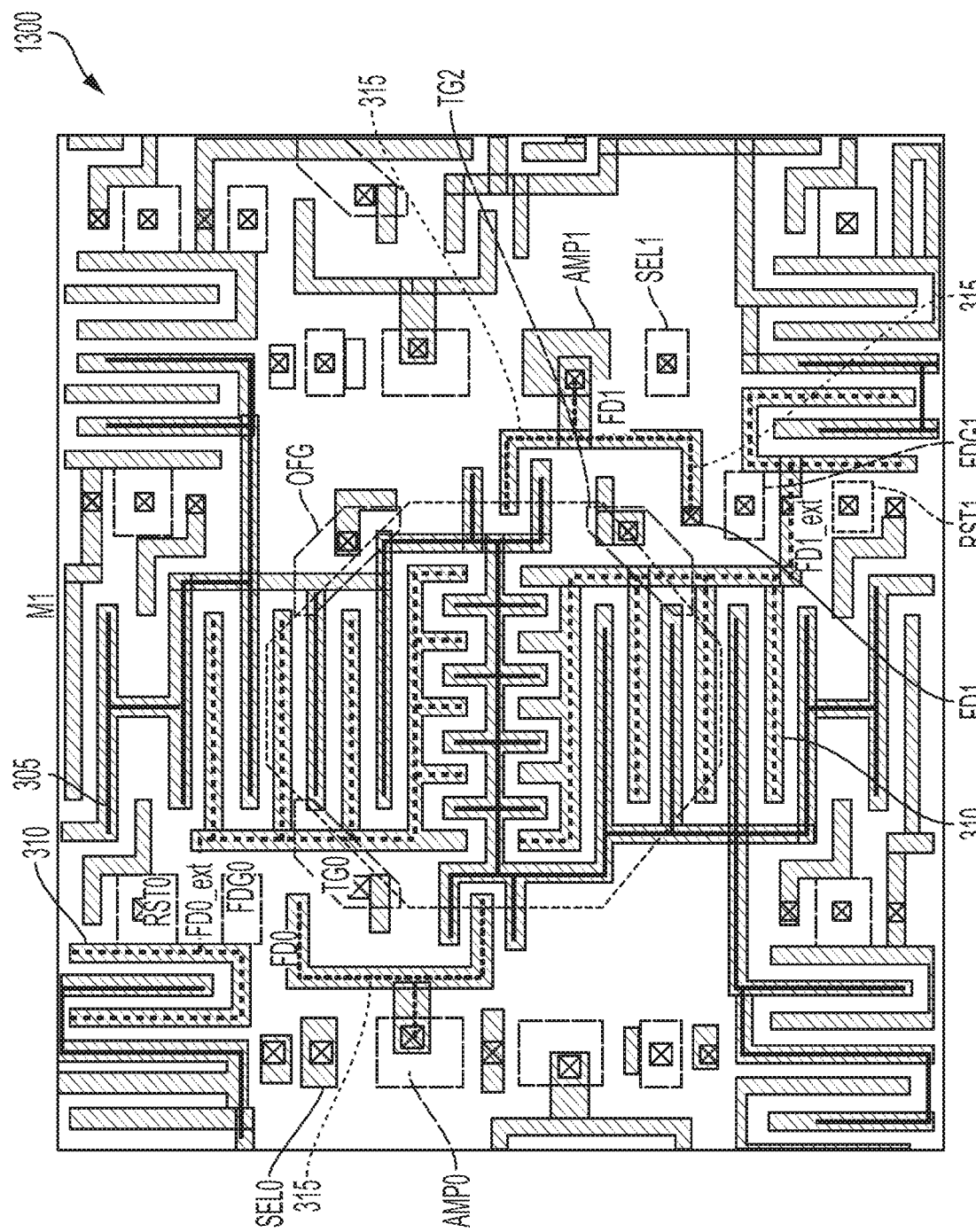
FIG. 13 illustrates a layout for wirings in a wiring layer of a pixel according to at least one example embodiment.
Figure 14:
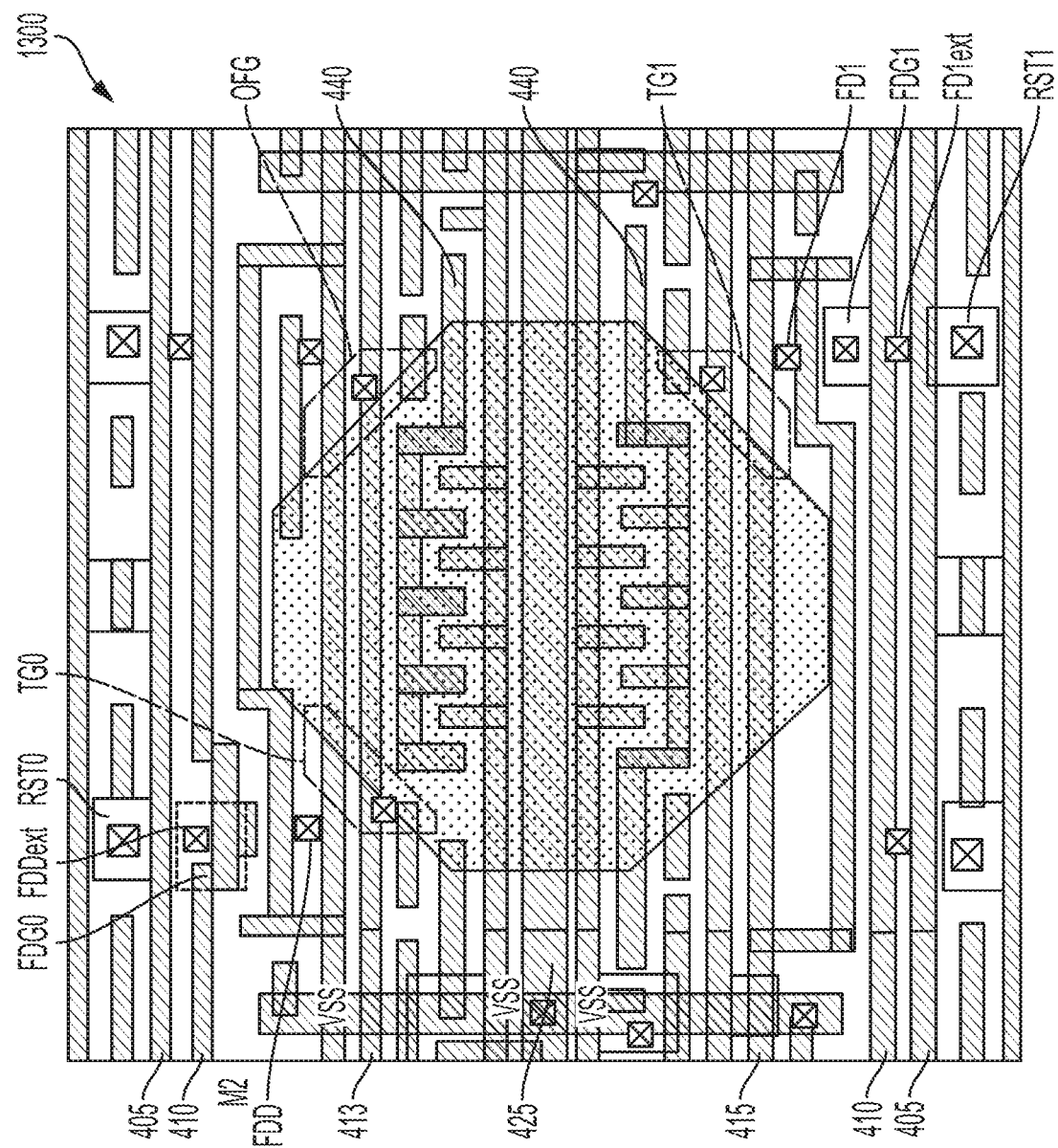
FIG. 14 illustrates a layout for wirings in another wiring layer of the pixel in FIG. 13 according to at least one example embodiment.
Figure 15:
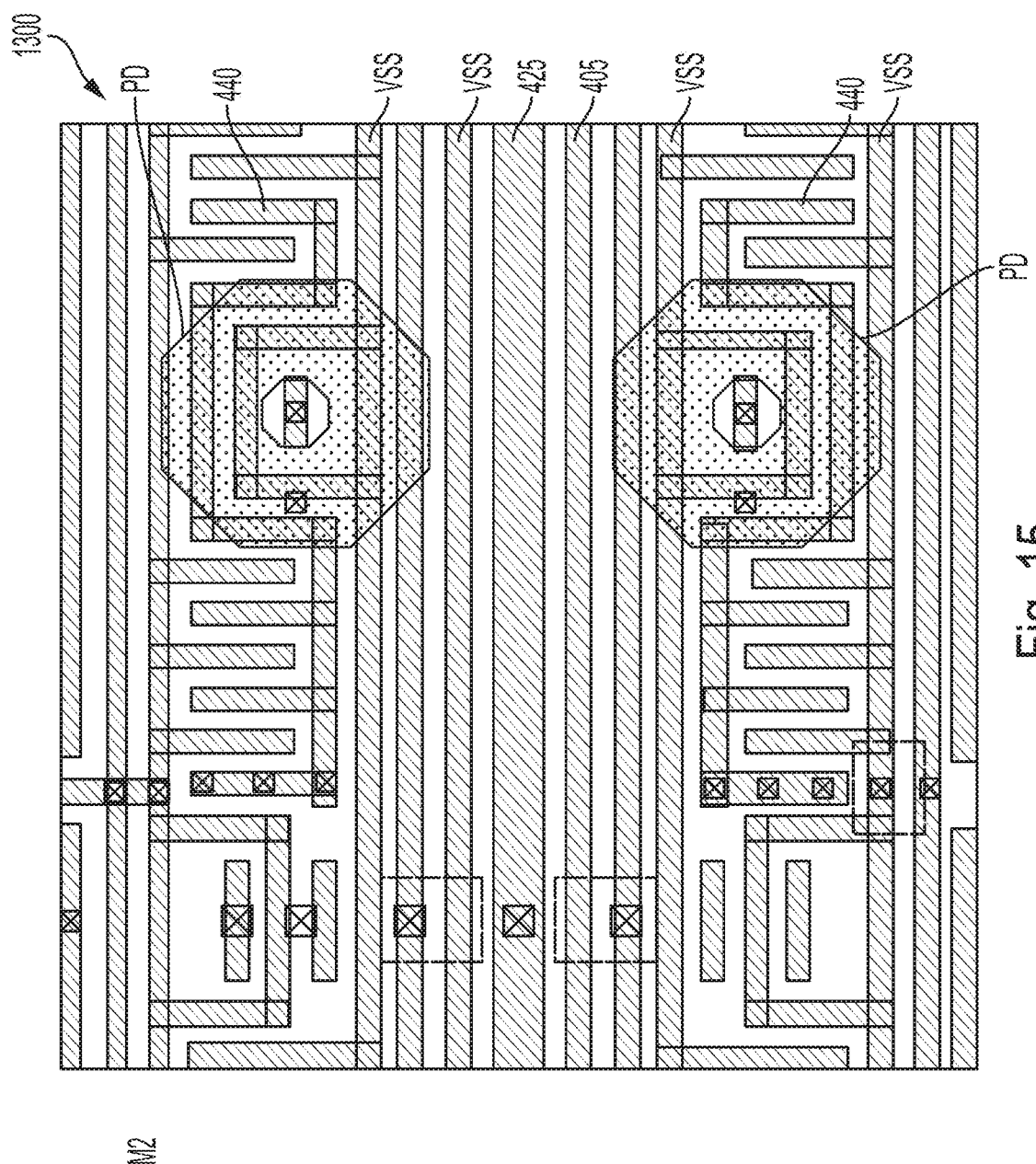
FIG. 15 illustrates a layout for wirings in another wiring layer of the pixel in FIG. 13 according to at least one example embodiment.

FIG. 13 illustrates a layout 1300 of a pixel including M1 wirings 305/310/315 according to at least one additional example embodiment. FIGS. 14 and 15 illustrate example layouts for M2 level wirings for the layout 1300 of FIG. 13. Here, FIG. 15 is simplified to show to two pixels with photoelectric conversion regions PD. FIGS. 14 and 15 further illustrate some of the same wirings from FIG. 4 to carry signals to various transistors, and a plurality of VSS or ground wirings (some labeled and some not labeled) that are designed to shield some desired percentage of the wirings 310 in FIG. 10. In FIGS. 14 and 15, wirings 440 are connected to a respective floating diffusion FD0ext/FD1ext and form an interdigitated pattern with the VSS wirings over the photoelectric conversion region (FIG. 14) or on sides of the photoelectric conversion region PD (FIG. 15).

Figure 16:
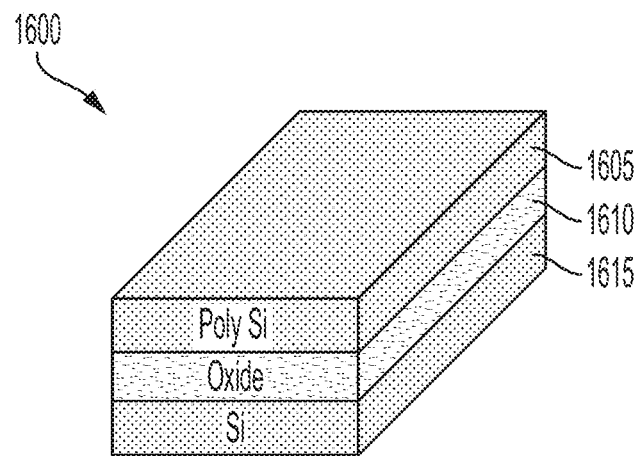
FIG. 16 illustrates an example capacitive structure that may be used as capacitors according to at least one example embodiment.
Figure 17:
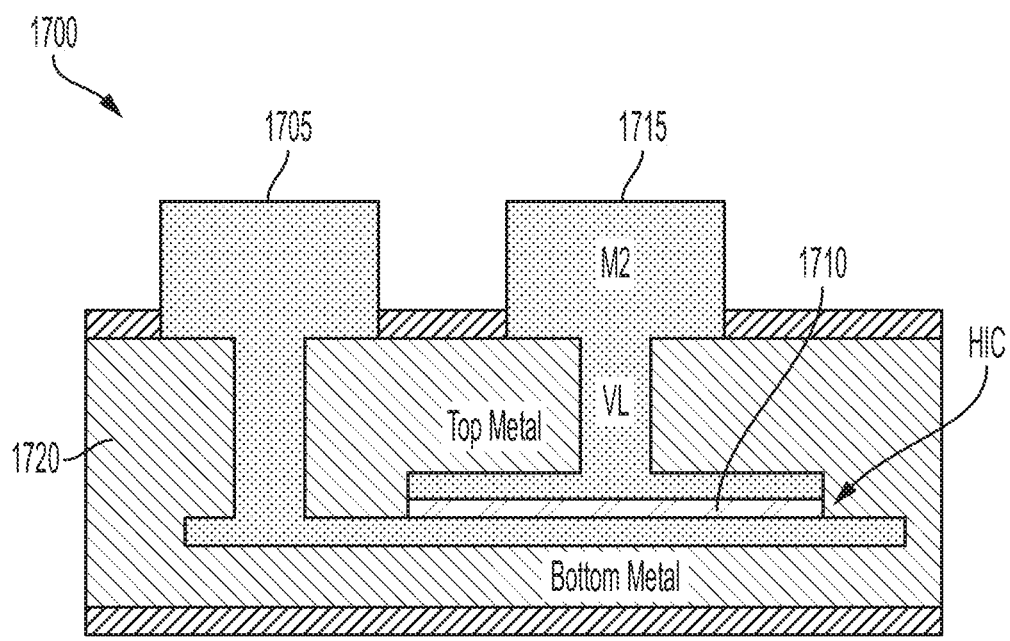
FIG. 17 illustrates an example capacitive structure that may be used as capacitors according to at least one example embodiment.

FIGS. 16 and 17 illustrates example capacitive structures 1600 and 1700 that may be used as capacitors for the floating diffusions FD and FDext according to at least one example embodiment. With reference to FIGS. 3-17, the capacitors may comprise finger capacitors, metal-insulator-semiconductor (MIS) capacitors, metal-insulator-metal (MIM) capacitors, ONO or SONOS capacitors, trench capacitors that may also function as deep trench isolation between pixels, MRAM elements, and/or RERAMs. FIG. 16 illustrates an example of a MIS capacitor 1600 that includes a polysilicon layer 1605, an oxide layer 1610 and a silicon layer 1615. FIG. 17 illustrates an example MIM capacitor 1700 that includes a first metal 1705, a dielectric layer 1710 (e.g., a high-k dielectric layer), and a second metal 1710, all of which may include portions formed in a substrate (e.g., an insulating layer) 1720.

Here, it should be further appreciated that in addition to matching capacitances for floating diffusions FDs and FDexts, gates of transistors TG0 and TG1 may be designed to have reduced or minimal mismatched gate capacitances. Such arrangement of gate metals may dependent on minimum metal line width available during fabrication, RC requirements, DRC rules, minimum via dimensions, spacing, and overlap, phase definition of each pixel (e.g., for IQ mosaic driving where pixels receive transfer signals with different phases, such as one pixel at 0 degrees and an adjacent pixel at 180 degrees), pixel dimension relative to minimum metal dimension, and/or a number of gates per pixel. FIGS. 19-31 illustrate example embodiments that relate to wirings for gates of the transistors.

Figure 18:
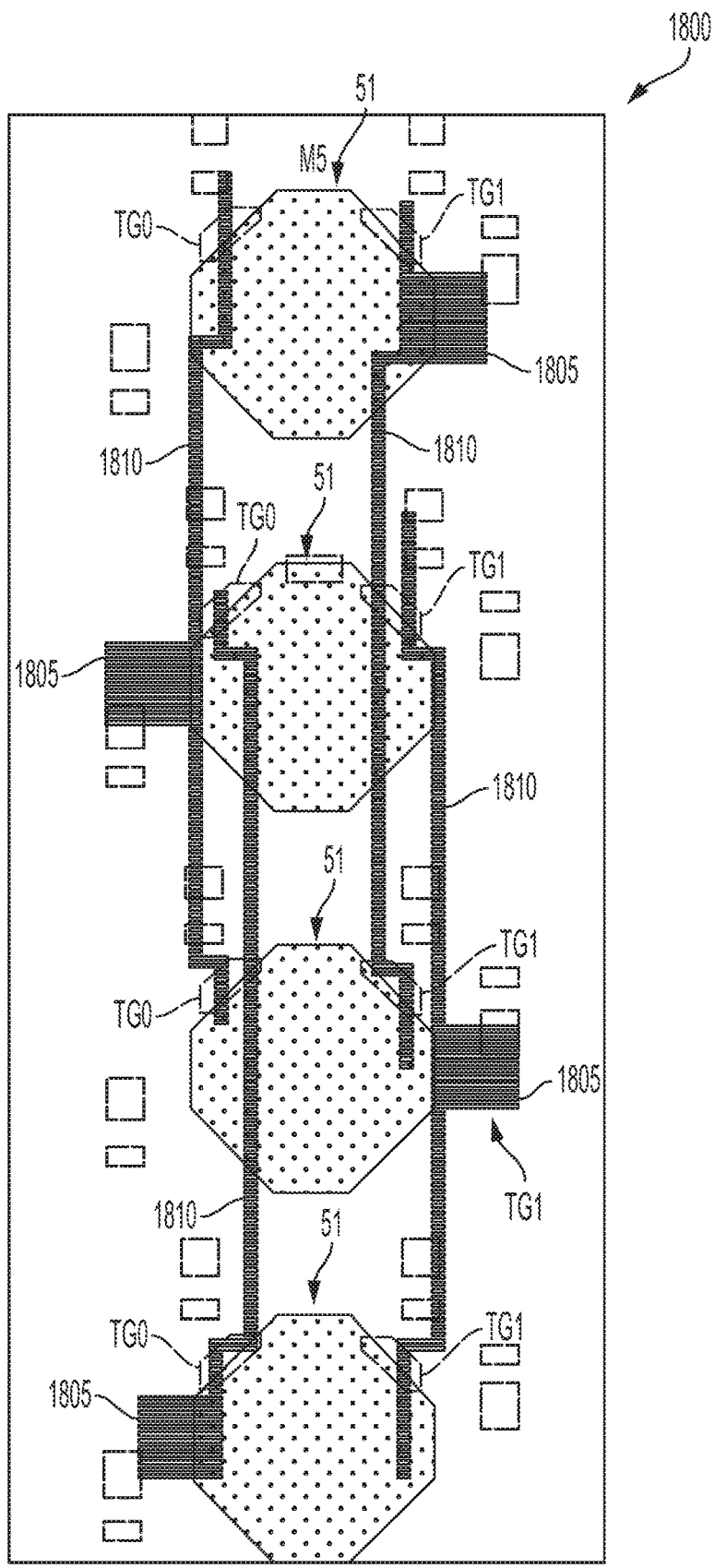
FIG. 18 illustrates a layout for wirings in a wiring layer of a pixel according to at least one example embodiment.
Figure 19:
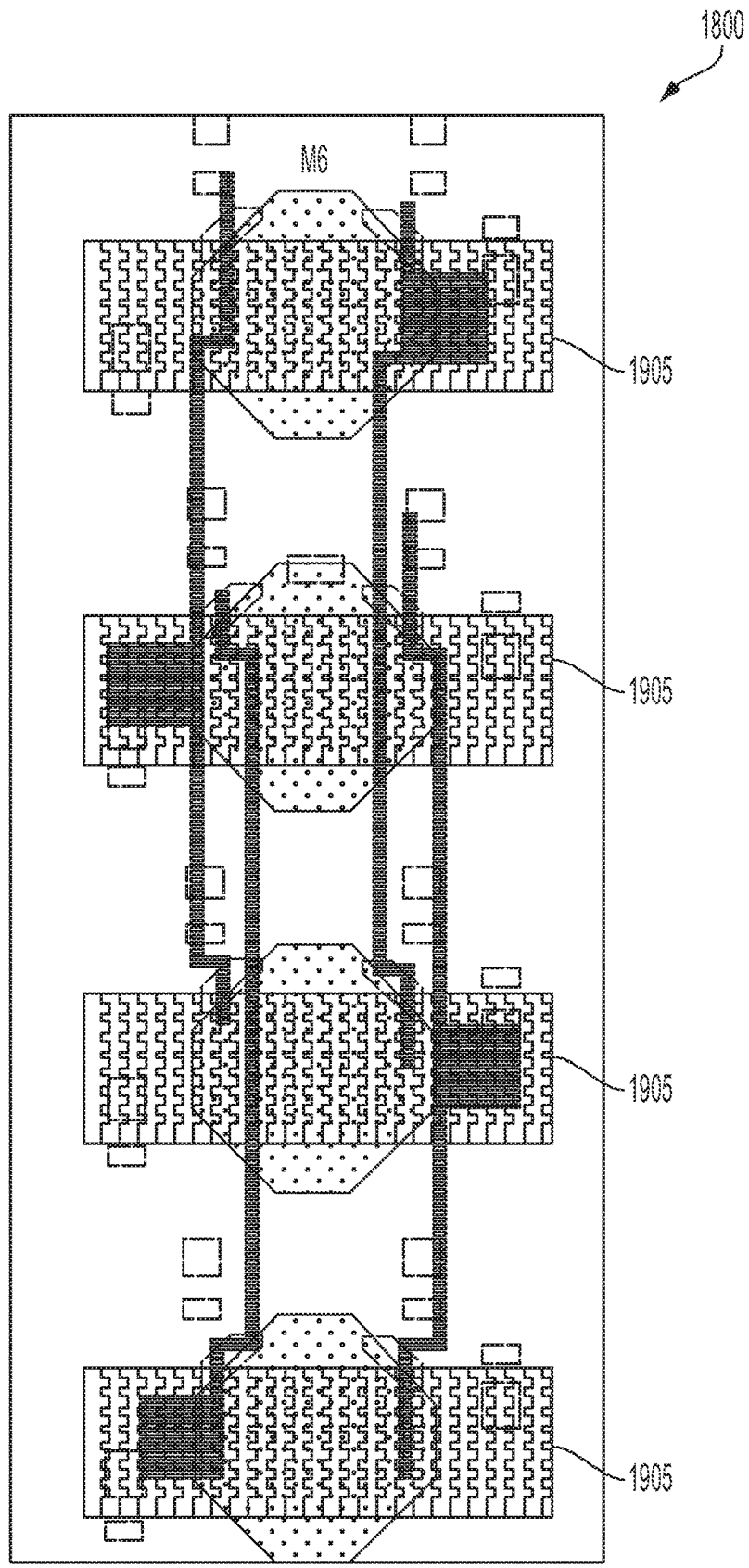
FIG. 19 illustrates a layout for wirings in another wiring layer of the pixel in FIG. 18 according to at least one example embodiment.

FIGS. 18 and 19 illustrate wiring layouts 1800 for connecting to gates of transistors of pixels 51 in a pixel array. FIG. 18 illustrates M5 level wirings while FIG. 19 illustrates M6 level wirings. As shown FIG. 18, the M5 level wirings include pad portions 1805 and linear portions 1810. As further shown, transistors TG for alternating photoelectric conversion regions of pixels 51 in a column are connected to one another linear portions 1810, which may be useful for IQ mosaic driving. FIG. 19 illustrates rectangular metal contacts 1905 for layer M6 that have respective via connections to the pad portion 1805 FIG. 18.

Figure 20:
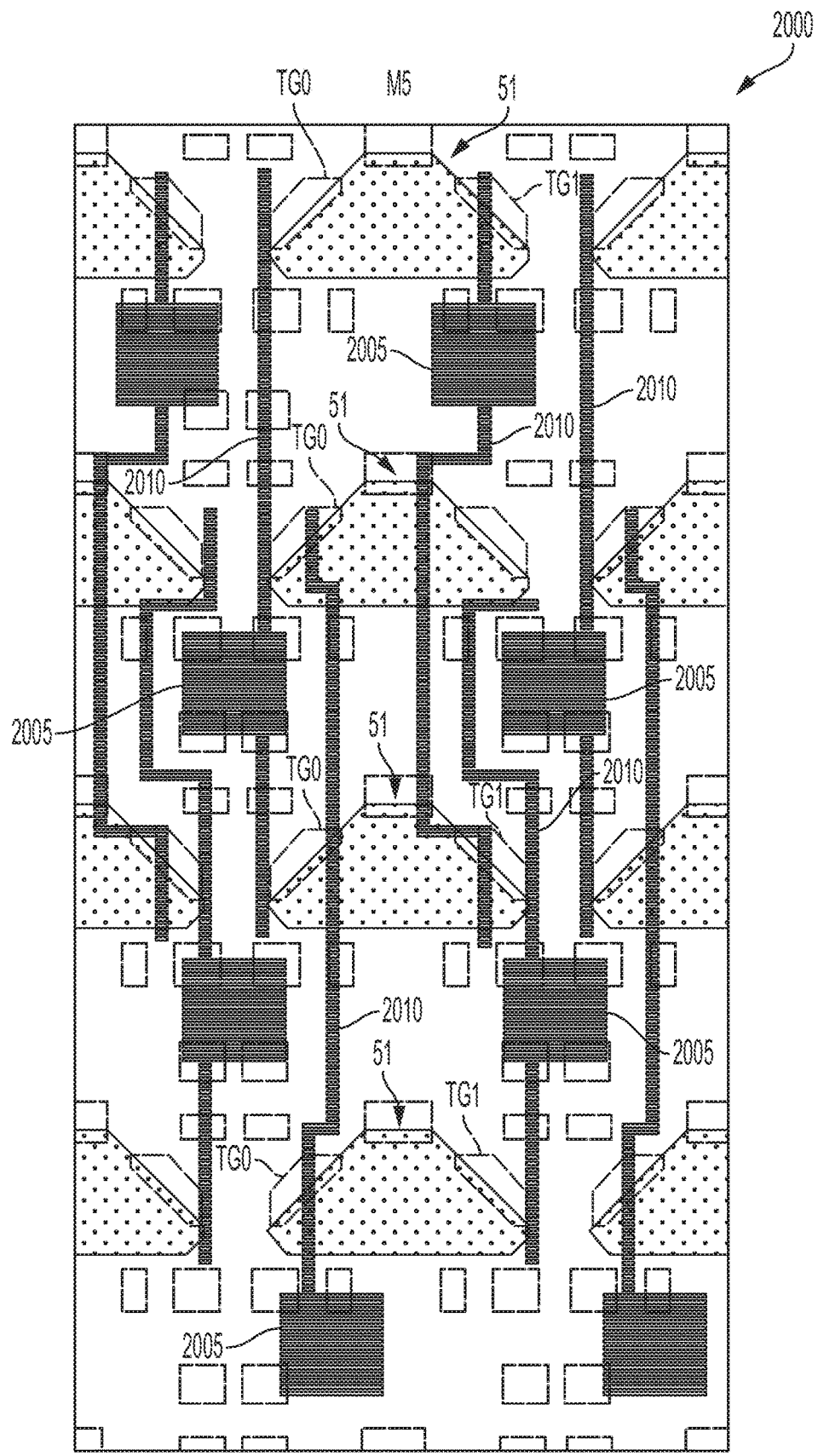
FIG. 20 illustrates a layout for wirings in a wiring layer of a pixel according to at least one example embodiment.
Figure 21:
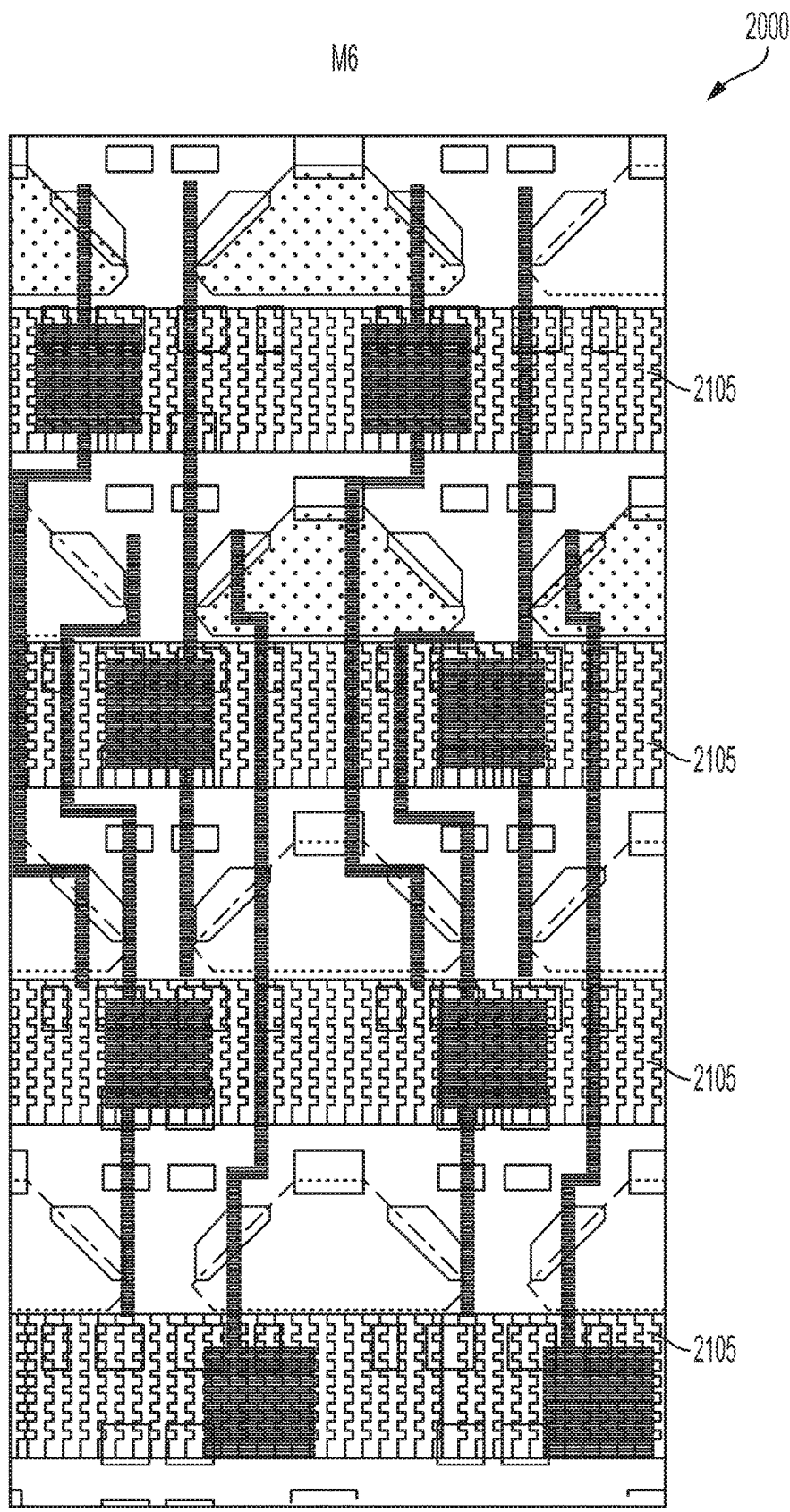
FIG. 21 illustrates a layout for wirings in another wiring layer of the pixel in FIG. 20 according to at least one example embodiment.

FIGS. 20 and 21 illustrate wiring layouts 2000 for connecting to gates of transistors of pixels 51 in a pixel array according to at least one example embodiment. For example, FIG. 20 illustrates an M5 wiring level with pad portions 2005 and linear portions 2010 while FIG. 21 illustrates an M6 wiring level with contacts 2105. Here, it should be appreciated that the contact points between the levels are vias at or near the pad portions 2005 of M5, which are located between photoelectric conversion regions PD in a column direction, where top and bottom pad portions 2005 are slightly offset from the four middle pad portions 2005 in a row direction.

Figure 22:
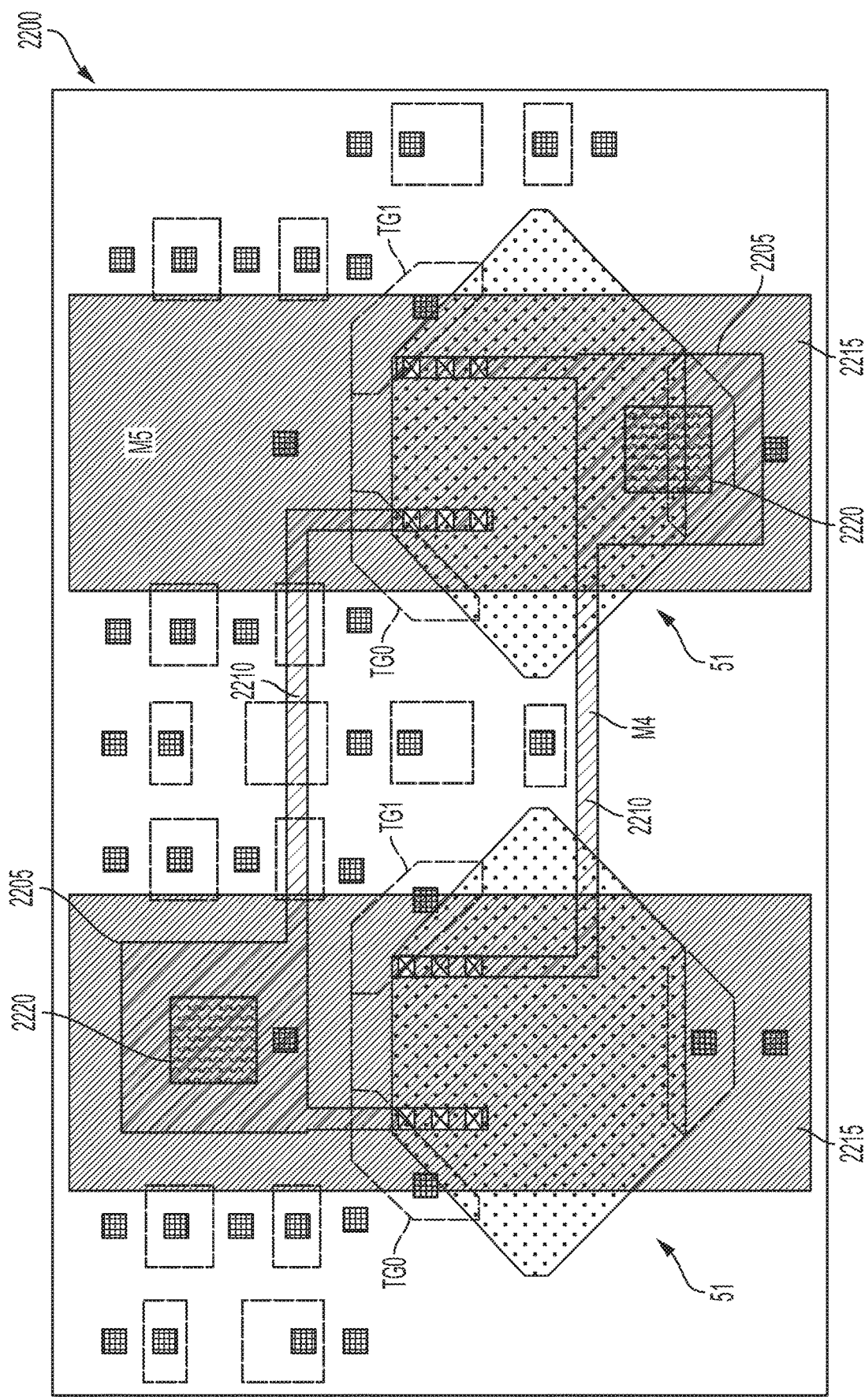
FIG. 22 illustrates a layout for wirings in two wiring layers of a pixel according to at least one example embodiment.

FIG. 22 illustrates a wiring layout 2200 for gate connections of transistors TG0/TG1 in the M4 and M5 wiring layers according to at least one example embodiment. As shown, the M4 layer includes pad portions 2205 and linear portions 2210 while the M5 layer includes rectangular contacts 2215. FIG. 22 further illustrates a connection via 2220 that connects the pad portions 2205 to the contacts 2215.

Figure 23:
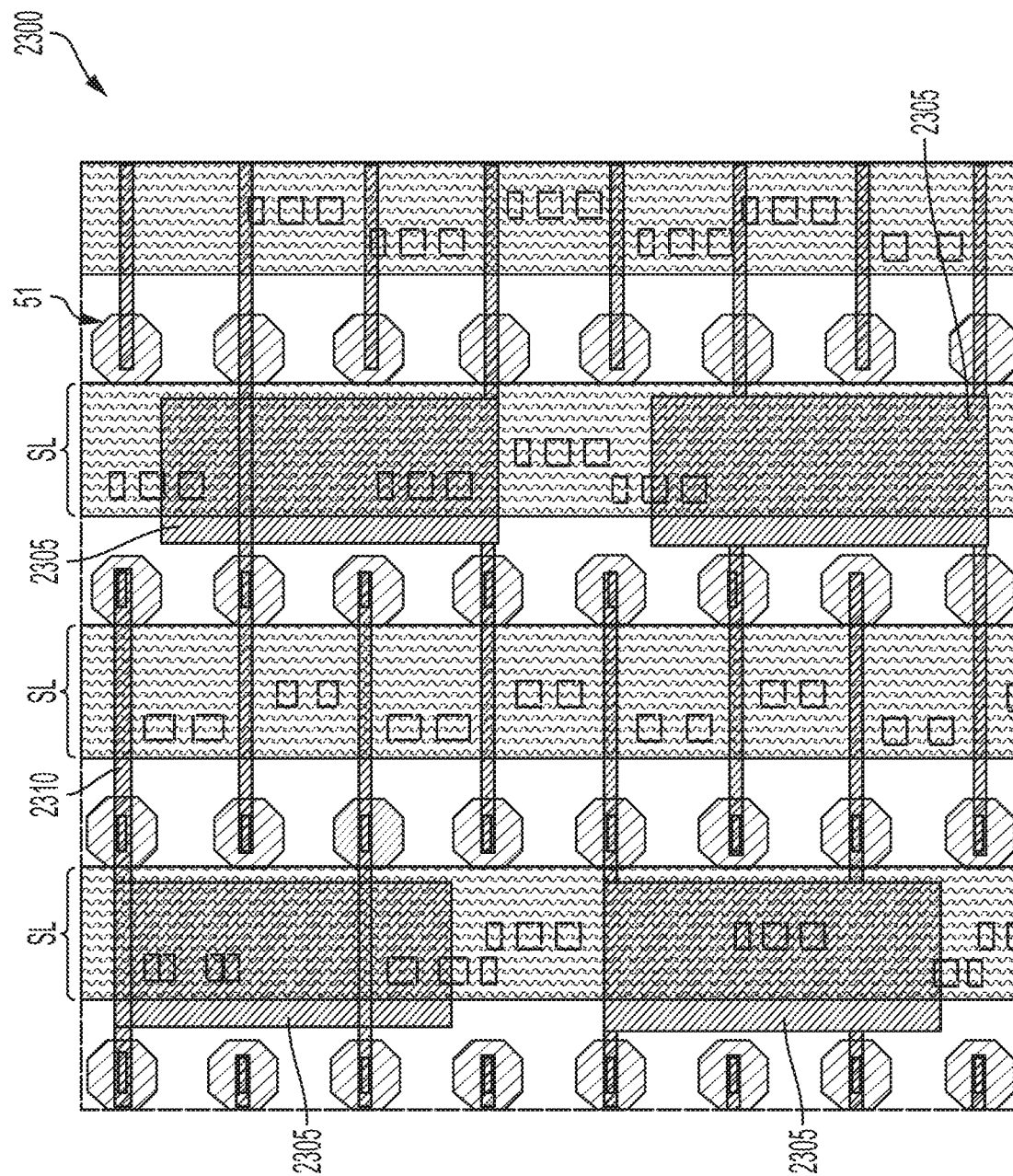
FIG. 23 illustrates a wiring layout for gate connections of transistors according to at least one other example embodiment.

FIG. 23 illustrates a wiring layout 2300 for gate connections of transistors according to at least one other example embodiment. For example, in FIG. 23, each gate contact 2305 may be used for connecting to transistors TG of a plurality of photoelectric conversion regions PD on both sides of a respective contact. That is, one gate contact 2305 is shared amongst a plurality of transfer transistors associated with different pixels 51. In addition, the contacts 2305 may be located between columns photoelectric conversion regions PD and/or overlap parts of the transistors for each photoelectric conversion region PD. Linear wirings 2310 are electrically connected between gates of transistors TG and the contacts 2305. FIG. 23 and FIGS. 4-31 further illustrate signal lines SL that extend vertically and that are arranged at generally regular intervals. The signal lines SL may be vertical signal lines connected to selection transistors of each pixel 51, and located in an M3 wiring layer. However, the wirings 2310 may be in an M4 wiring layer that connect to points that are in central regions of the photoelectric conversion regions PD. Here, it should be understood that one or more other wiring layers M1, M2, M3 include connection points to the transfer transistors TG that overlap the transfer transistors TG.

Figure 24:
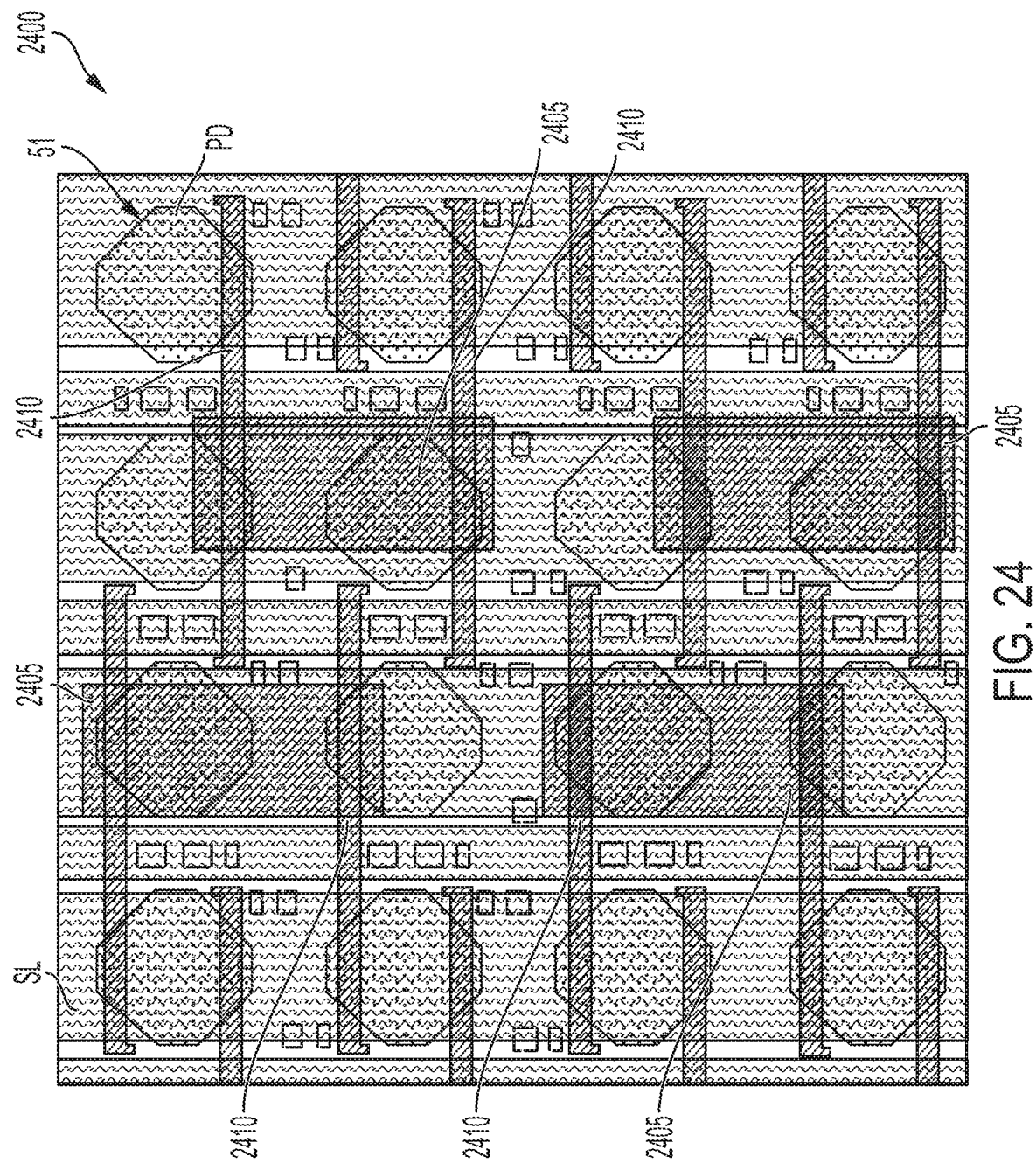
FIG. 24 illustrates a layout of the shared gate contact structure shown in FIG. 23 according to at least one other example embodiment.

FIG. 24 illustrates layout 2400 that is a variation of the shared gate contact structure shown in FIG. 23. In FIG. 24, linear wirings 2410 are electrically connected between transistors TG located at opposing corners of photoelectric conversion regions PD and contacts 2405.

Figure 25:
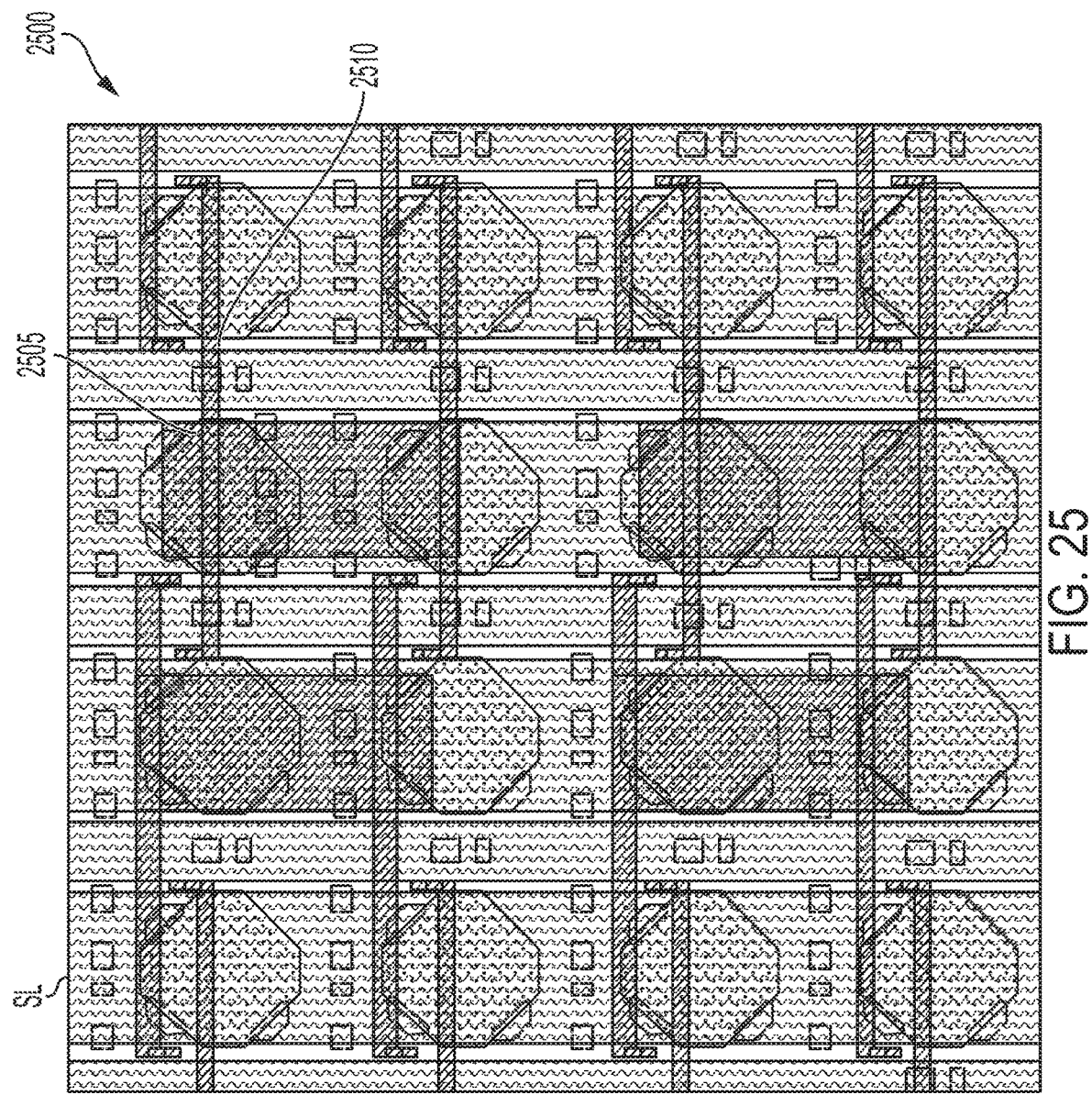
FIG. 25 illustrates example layout of shared gate contacts in a wiring layer according to at least one example embodiment.
Figure 26:
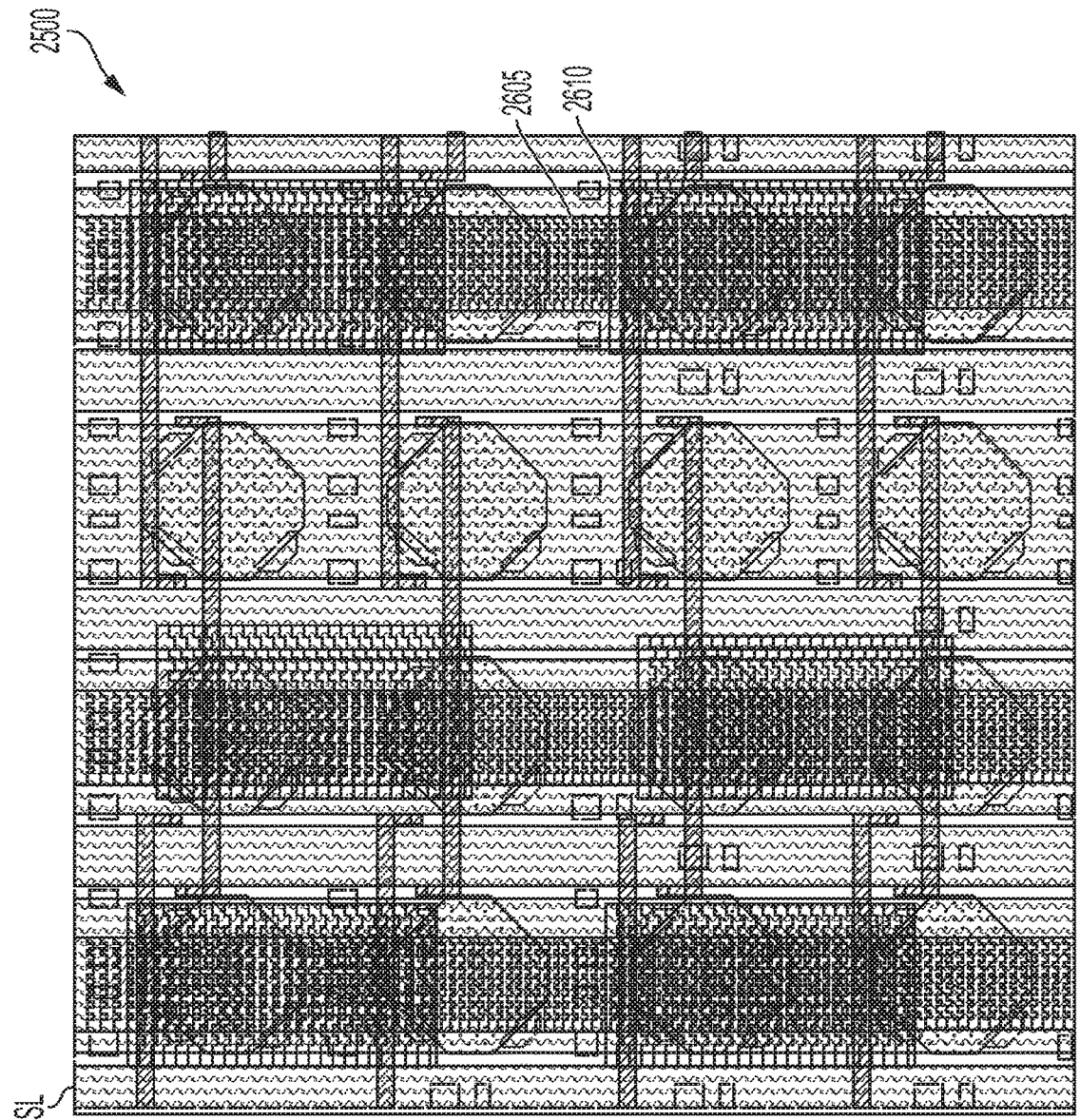
FIG. 26 illustrates an example layout of shared gate contacts in another wiring layer of the layout in FIG. 25 according to at least one example embodiment

FIGS. 25 and 26 illustrate another example layout 2500 of shared gate contacts 2505, where each figure illustrates a different wiring level (e.g., M5 in FIG. 25 and M6 in FIG. 26). As shown, a contact strip 2605 in FIG. 26 may include portions 2610 that completely overlap the contact in level M5. In FIGS. 25 and 26, each gate contact 2505 may overlap portions of two photoelectric conversion regions PD.

Figure 27:
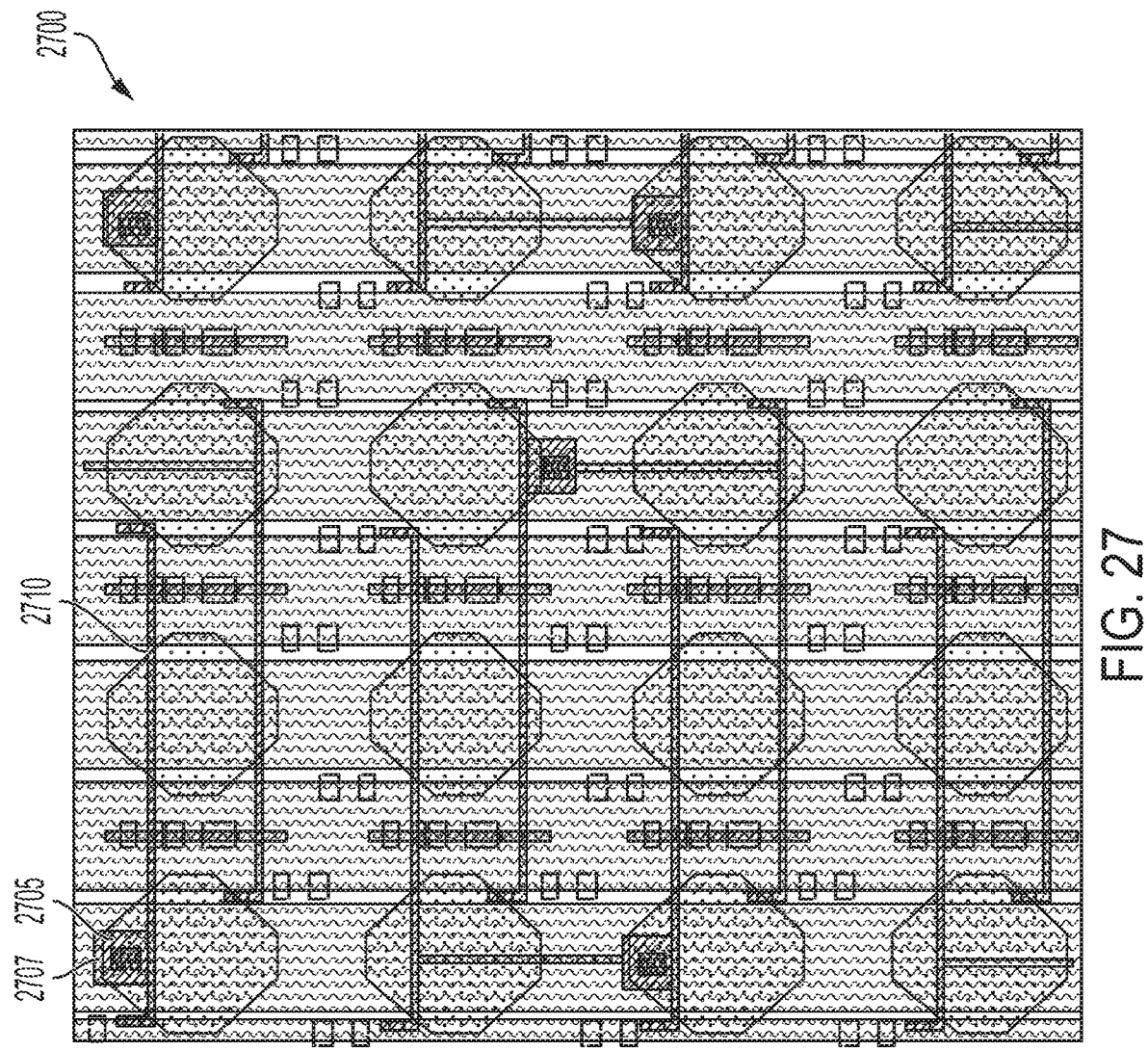
FIG. 27 illustrates a shared gate contact structure in a wiring layer according to at least one example embodiment.
Figure 28:
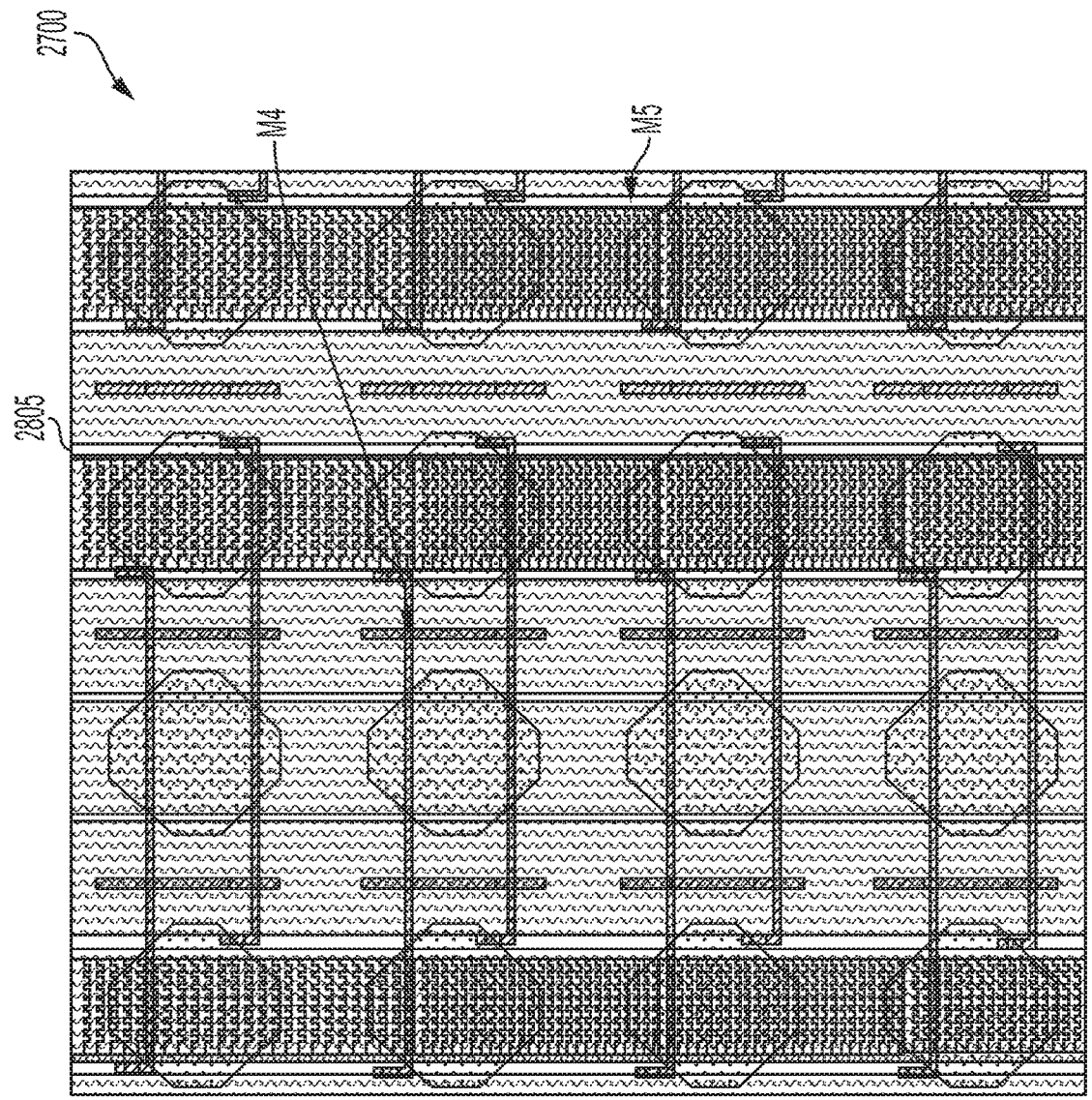
FIG. 28 illustrates a shared gate contact structure in another wiring layer of the layout in FIG. 27 according to at least one example embodiment.
Figure 29:
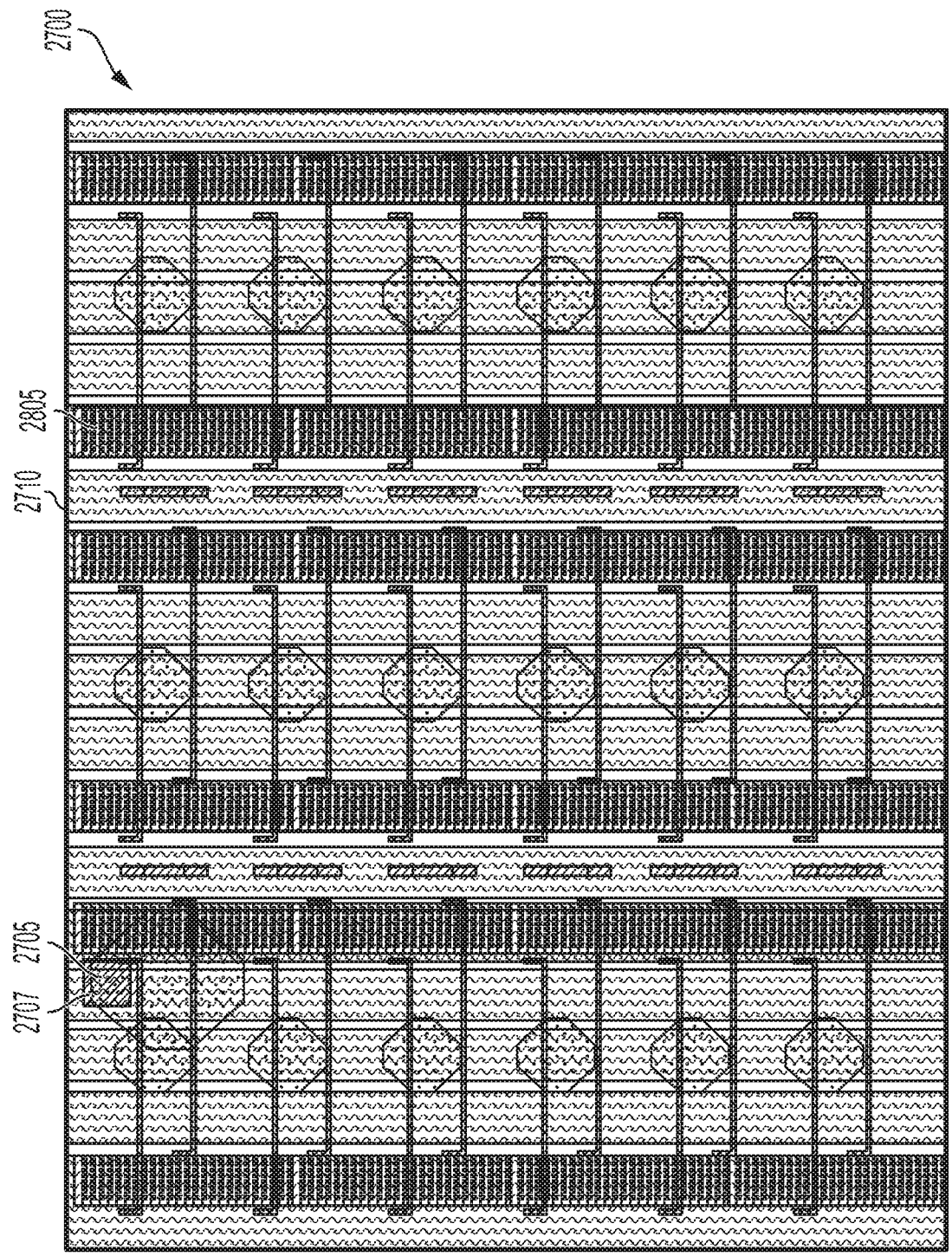
FIG. 29 illustrates a more complete array of pixels having the wiring layers of FIGS. 27 and 28 according to at least one example embodiment.

FIGS. 27-29 illustrate another variation of a shared gate contact structure according to at least one example embodiment. FIG. 27 shows a layout 2700 with an M4 level contact 2705, via 2707, and linear wirings 2710, while FIG. 28 shows an M5 level contact strip 2805. FIG. 29 shows the structures of FIGS. 27 and 28 for a larger pixel array.

Figure 30:
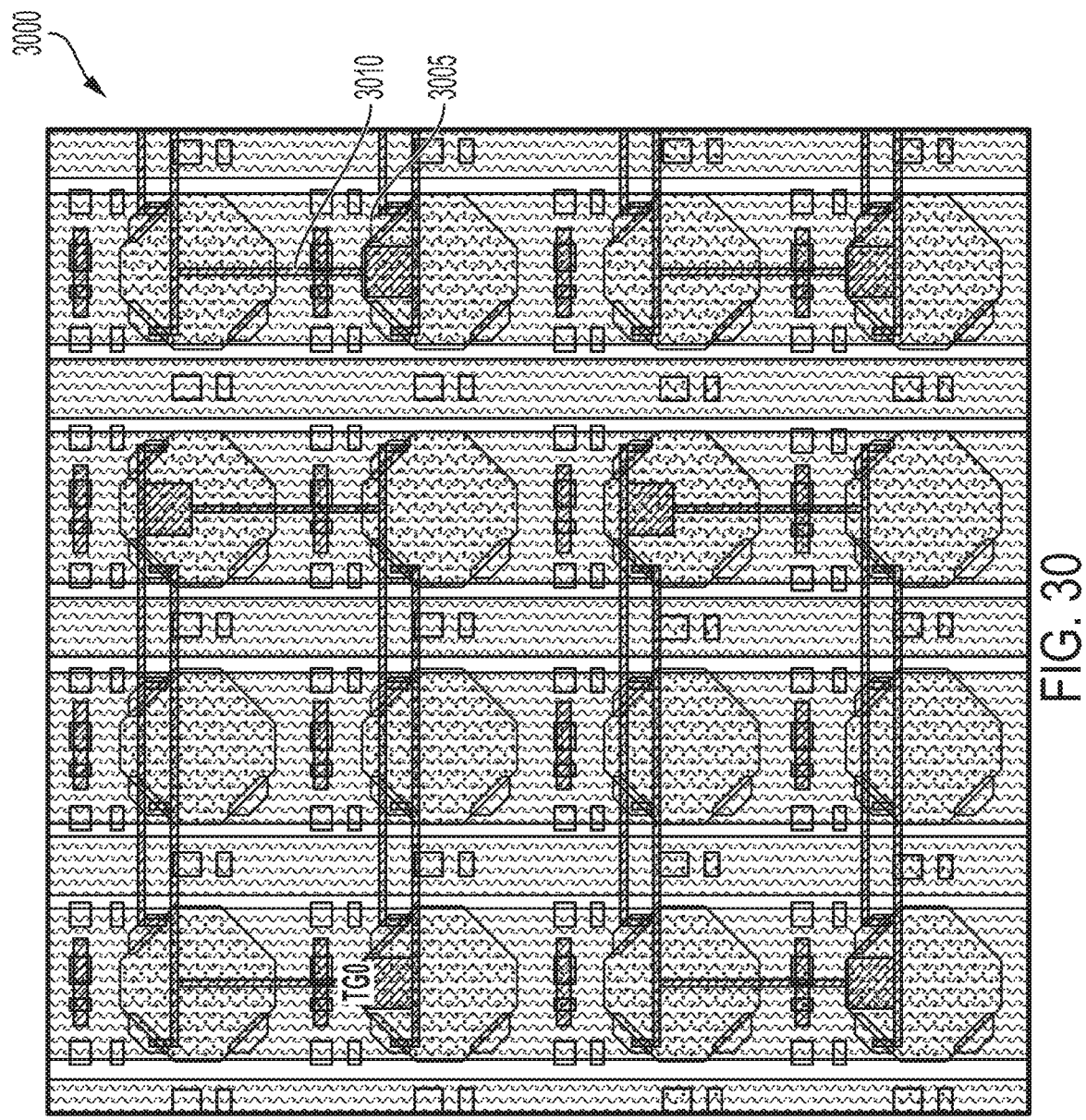
FIG. 30 illustrates a layout of a shared gate contact structure in a wiring layer according to at least one example embodiment.
Figure 31:
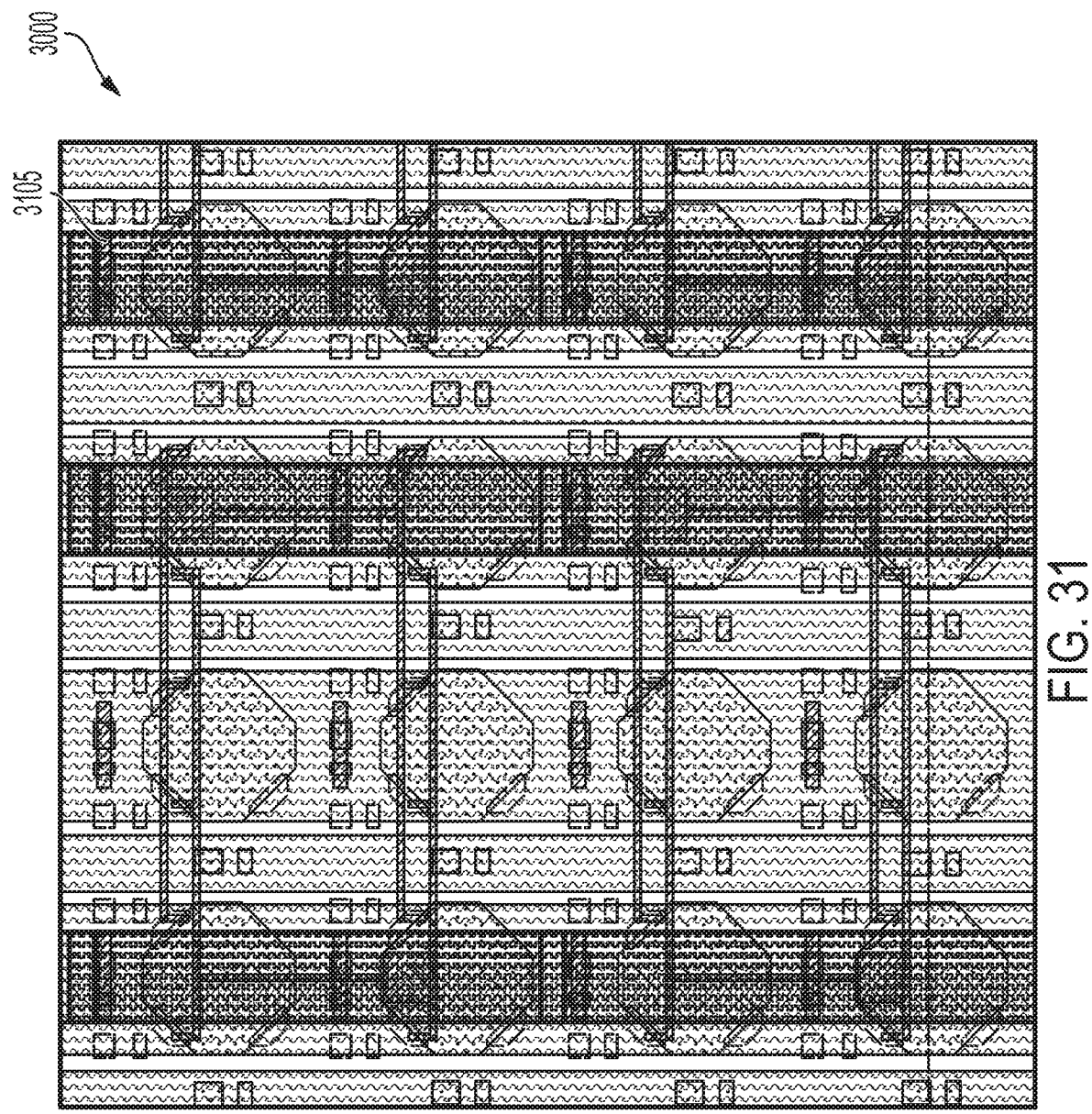
FIG. 31 illustrates a layout of a shared gate contact structure in another wiring layer of the layout in FIG. 30 according to at least one example embodiment.

FIGS. 30 and 31 illustrate a layout 3000 that is another variation of a shared gate contact structure according to at least one example embodiment. FIG. 30 shows an M4 level contact 3005 and linear wirings 3010 while FIG. 31 shows an M5 level contact strip 3105.

With reference to FIGS. 3-31, it should be appreciated that example embodiments are not limited to the patterns and layouts shown therein, and may vary according to design preferences. In addition, it should be appreciated that other wiring layers of an imaging device are shown, but not described in detail.

Systems/devices that may incorporate the above described imaging devices will now be described.

Figure 32:
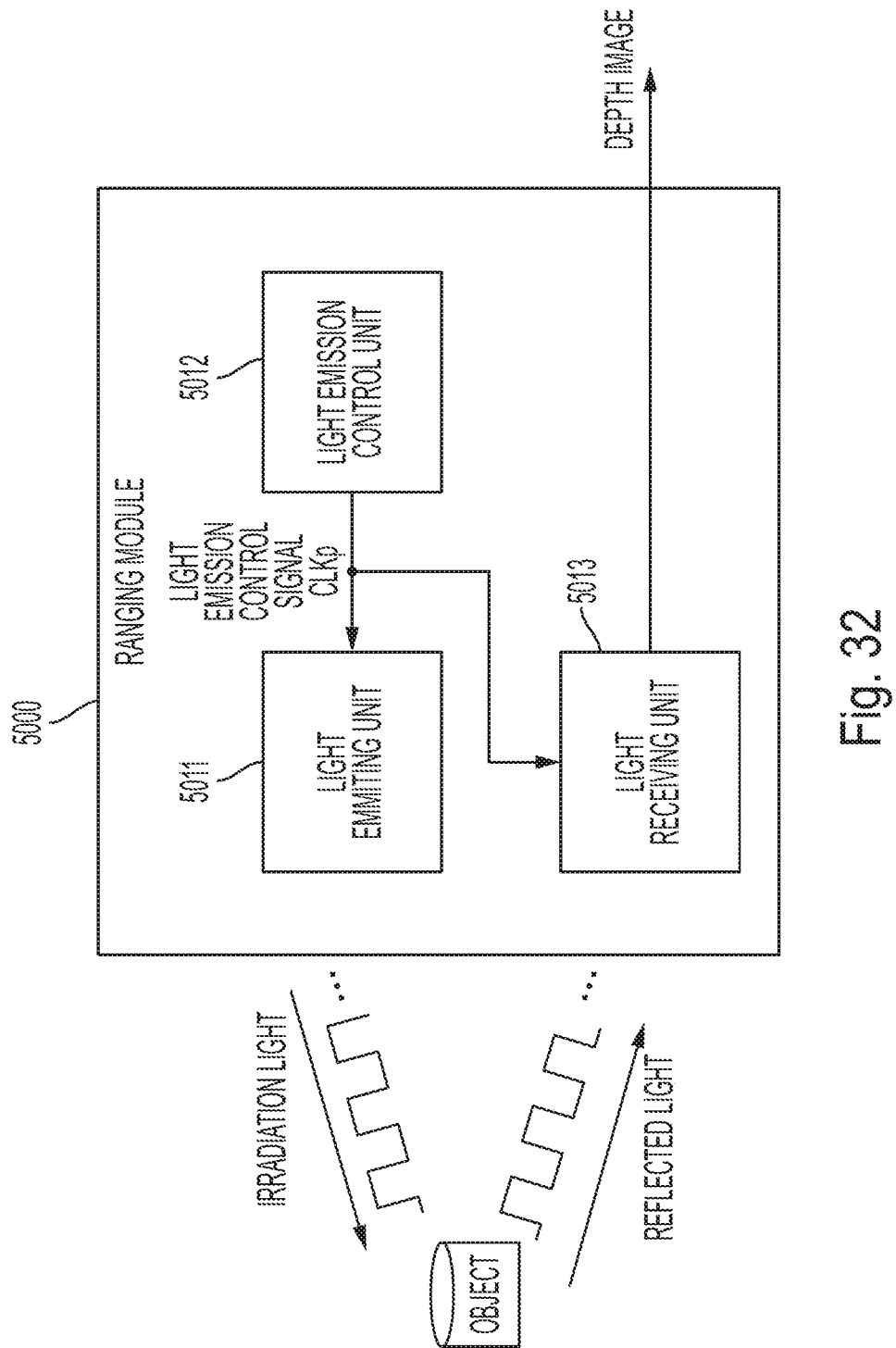
FIG. 32 is a block diagram illustrating an example of a ranging module according to at least one example embodiment.

FIG. 32 is a block diagram illustrating an example of a ranging module according to at least one example embodiment.

The ranging module 5000 includes a light emitting unit 5011, a light emission control unit 5012, and a light receiving unit 5013.

The light emitting unit 5011 has a light source that emits light having a predetermined wavelength, and irradiates the object with irradiation light of which brightness periodically changes. For example, the light emitting unit 5011 has a light emitting diode that emits infrared light having a wavelength in a range of 780 nm to 1000 nm as a light source, and generates the irradiation light in synchronization with a light emission control signal CLKp of a rectangular wave supplied from the light emission control unit 5012.

Note that, the light emission control signal CLKp is not limited to the rectangular wave as long as the control signal CLKp is a periodic signal. For example, the light emission control signal CLKp may be a sine wave.

The light emission control unit 5012 supplies the light emission control signal CLKp to the light emitting unit 5011 and the light receiving unit 5013 and controls an irradiation timing of the irradiation light. A frequency of the light emission control signal CLKp is, for example, 20 megahertz (MHz). Note that, the frequency of the light emission control signal CLKp is not limited to 20 megahertz (MHz), and may be 5 megahertz (MHz) or the like.

The light receiving unit 5013 receives reflected light reflected from the object, calculates the distance information for each pixel according to a light reception result, generates a depth image in which the distance to the object is represented by a gradation value for each pixel, and outputs the depth image.

The above-described imaging device 1 is used for the light receiving unit 5013, and for example, the imaging device 1 serving as the light receiving unit 5013 calculates the distance information for each pixel from a signal intensity detected by each tap, on the basis of the light emission control signal CLKp.

As described above, the imaging device 1 shown in FIG. 1 is able to be incorporated as the light receiving unit 5013 of the ranging module 5000 that obtains and outputs the information associated with the distance to the subject by the indirect ToF method. By adopting the imaging device 1 of one or more of the embodiments described above, it is possible to improve one or more distance measurement characteristics of the ranging module 5000 (e.g., distance accuracy, speed of measurement, and/or the like).

Figure 33:
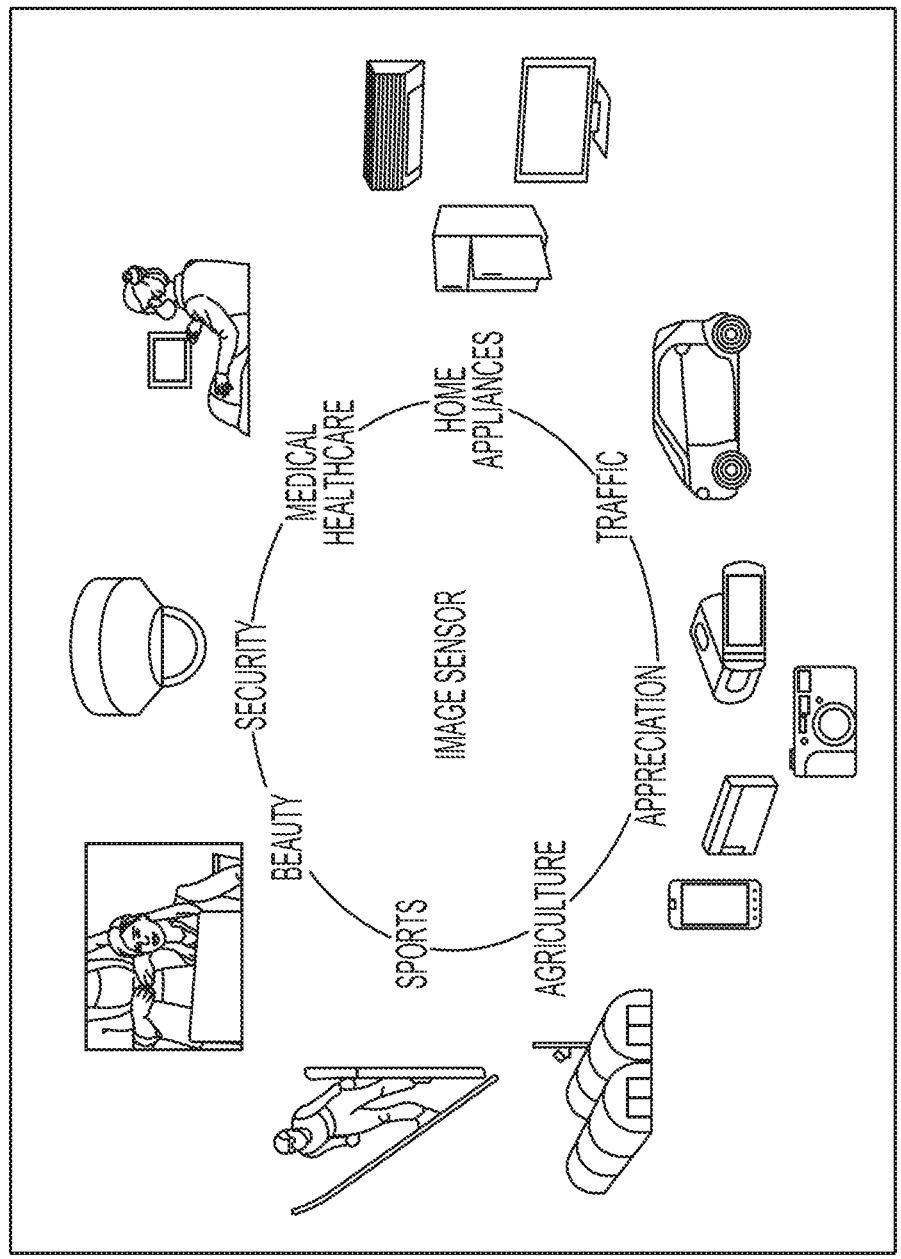
FIG. 33 is a diagram illustrating use examples of an imaging device according to at least one example embodiment.

FIG. 33 is a diagram illustrating use examples of an imaging device 1 according to at least one example embodiment.

For example, the above-described imaging device 1 (image sensor) can be used in various cases of sensing light such as visible light, infrared light, ultraviolet light, and X-rays as described below. The imaging device 1 may be included in apparatuses such as a digital still camera and a portable device with a camera function which capture images, apparatuses for traffic such as an in-vehicle sensor that captures images of a vehicle to enable automatic stopping, recognition of a driver state, measuring distance, and the like. The imaging device 1 may be included in apparatuses for home appliances such as a TV, a refrigerator, and an air-conditioner in order to photograph a gesture of a user and to perform an apparatus operation in accordance with the gesture. The imaging device 1 may be included in apparatuses for medical or health care such as an endoscope and an apparatus that performs angiography through reception of infrared light. The imaging device 1 may be included in apparatuses for security such as a security monitoring camera and a personal authentication camera. The imaging device 1 may be included in an apparatus for beauty such as a skin measuring device that photographs skin. The imaging device 1 may be included in apparatuses for sports such as an action camera, a wearable camera for sports, and the like. The imaging device 1 may be included in apparatuses for agriculture such as a camera for monitoring a state of a farm or crop.

Example embodiments will now be discussed with reference to FIGS. 1-33.

At least one example embodiment is directed to an imaging device 1 including a pixel 51 including a photoelectric conversion region PD, a first transfer transistor TG0 coupled to the photoelectric conversion region PD to transfer charge generated by the photoelectric conversion region PD, a first floating diffusion FD0 coupled to the first transfer transistor TG0, a second floating diffusion FD0ext, a second transfer transistor FDG0 coupled between the first floating diffusion FD0 and the second floating diffusion FD0ext to control access to the second floating diffusion FD0ext, a third transfer transistor TG1 coupled to the photoelectric conversion region PD to transfer charge generated by the photoelectric conversion region PD, a third floating diffusion FD1 coupled to the second transfer transistor TG1, a fourth floating diffusion FD1ext, and a fourth transfer transistor FDG1 coupled between the third floating diffusion FD1 and the fourth floating diffusion FD1ext to control access to the fourth floating diffusion FD1ext. The imaging device 1 includes a first wiring layer M1 including a first wiring 310 connected to the second floating diffusion FD0ext, a second wiring 310 connected to the fourth floating diffusion FD1ext, and a third wiring 305 connected to ground and capacitively coupled with the first wiring 310 and the second wiring 310.

According to at least one example embodiment, the first wiring 310 overlaps the photoelectric conversion region PD and has a first pattern, the second wiring 310 overlaps the photoelectric conversion region PD and has a second pattern, and the third wiring 305 overlaps the photoelectric conversion region and has a third pattern.

According to at least one example embodiment, the third pattern has line symmetry in a first direction (see, for example, wiring 305 FIG. 3).

According to at least one example embodiment, the first pattern and the second pattern form a combination pattern that includes an interdigitated section where portions of the third wiring 305 are interdigitated with portions of the first wiring 310 and the second wiring 310 (see, for example, FIG. 3).

According to at least one example embodiment, the interdigitated section has line symmetry in a first direction (e.g., a vertical direction).

According to at least one example embodiment, the interdigitated section is asymmetrical (see, for example, FIG. 10).

According to at least one example embodiment, the wiring layer M1 includes a fourth wiring 315 that connects the first floating diffusion FD0 to a first amplification transistor AMP0, and a fifth wiring 315 that connects the third floating diffusion FD1 to a second amplification transistor AMP1. The fourth and fifth wirings include dummy portions.

According to at least one example embodiment, patterns of the fourth wiring and the fifth wiring have point symmetry with respect to a reference point (see, for example, FIG. 3 where the reference point is a center of the photoelectric conversion region PD).

According to at least one example embodiment, the imaging device 1 includes a second wiring layer M2 including a fourth wiring 440 connected to the second floating diffusion, a fifth wiring 440 connected to the fourth floating diffusion, and a sixth wiring 420 connected to ground and capacitively coupled to the fourth wiring 440 and the fifth wiring 440.

According to at least one example embodiment, the fourth wiring 440 overlaps the photoelectric conversion region PD and has a fourth pattern, the fifth wiring 440 overlaps the photoelectric conversion region PD and has a fifth pattern, and the sixth wiring 420 overlaps the photoelectric conversion region PD and has a sixth pattern.

According to at least one example embodiment, the sixth pattern has line symmetry in a first direction (e.g., a vertical direction) and a second direction (e.g., a vertical direction).

According to at least one example embodiment, the fourth pattern and the fifth pattern form a combination pattern that includes an interdigitated section where portions of the sixth wiring 420 are interdigitated with portions of the fourth wiring 440 and the fifth wiring 440. According to at least one example embodiment, the interdigitated section has line symmetry in a first direction (a horizontal or vertical direction).

According to at least one example embodiment, the first pattern, the second pattern, and the third pattern have point symmetry with respect to a reference point (see, for example, FIG. 13).

According to at least one example embodiment, the imaging device 1 includes a third wiring layer M3 including a plurality of vertical signal lines SL that overlap the photoelectric conversion region (see FIGS. 23-31).

According to at least one example embodiment, the imaging device 1 includes a fourth wiring layer (e.g., M4 or M5) that includes a first gate wiring and a first gate pad electrically connected to a gate of the first transfer transistor and a gate of fifth transfer transistor of another pixel, and a second gate wiring and a second gate pad electrically connected to a gate of the second transfer transistor and a gate of a sixth transfer transistor of the another pixel (see FIGS. 23-31).

According to at least one example embodiment, the imaging device 1 includes a fifth wiring layer (e.g., M5 or M6) including a first contact strip electrically connected to the first gate pad, and a second contact strip electrically connected to the second gate pad (see, FIGS. 23-31).

According to at least one example embodiment, the first gate wiring, the first gate pad, and the first contact strip overlap the photoelectric conversion region (see FIGS. 23-31).

At least one example embodiment is directed to a system including the above described imaging device 1 a light source 5011.

Any processing devices, control units, processing units, etc. discussed above may correspond to one or many computer processing devices, such as a Field Programmable Gate Array (FPGA), an Application-Specific Integrated Circuit (ASIC), any other type of Integrated Circuit (IC) chip, a collection of IC chips, a microcontroller, a collection of microcontrollers, a microprocessor, Central Processing Unit (CPU), a digital signal processor (DSP) or plurality of microprocessors that are configured to execute the instructions sets stored in memory.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as an embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

Example embodiments may be configured as follows:

(1) An imaging device, comprising:
    a pixel including:
        a photoelectric conversion region;
        a first transfer transistor coupled to the photoelectric conversion region to transfer charge generated by the photoelectric conversion region;
        a first floating diffusion coupled to the first transfer transistor;
        a second floating diffusion;
        a second transfer transistor coupled between the first floating diffusion and the second floating diffusion to control access to the second floating diffusion;
        a third transfer transistor coupled to the photoelectric conversion region to transfer charge generated by the photoelectric conversion region; and
        a third floating diffusion coupled to the second transfer transistor;
        a fourth floating diffusion; and
        a fourth transfer transistor coupled between the third floating diffusion and the fourth floating diffusion to control access to the fourth floating diffusion; and
    a first wiring layer including:

a first wiring connected to the second floating diffusion;
a second wiring connected to the fourth floating diffusion; and
a third wiring connected to ground and capacitively coupled with the first wiring and the second wiring.
(2) The imaging device of (1), wherein the first wiring overlaps the photoelectric conversion region and has a first pattern, the second wiring overlaps the photoelectric conversion region and has a second pattern, and the third wiring overlaps the photoelectric conversion region and has a third pattern.
(3) The imaging device of one or more of (1) to (2), wherein the third pattern has line symmetry in a first direction.
(4) The imaging device of one or more of (1) to (3), wherein the first pattern and the second pattern form a combination pattern that includes an interdigitated section where portions of the third wiring are interdigitated with portions of the first wiring and the second wiring.
(5) The imaging device of one or more of (1) to (4), wherein the interdigitated section has line symmetry in a first direction.
(6) The imaging device of one or more of (1) to (5), wherein the interdigitated section is asymmetrical.
(7) The imaging device of one or more of (1) to (6), wherein the wiring layer includes:
a fourth wiring that connects the first floating diffusion to a first amplification transistor; and
a fifth wiring that connects the third floating diffusion to a second amplification transistor, wherein the fourth and fifth wirings include dummy portions.
(8) The imaging device of one or more of (1) to (7), wherein patterns of the fourth wiring and the fifth wiring have point symmetry with respect to a reference point.
(9) The imaging device of one or more of (1) to (8), further comprising:
a second wiring layer including:
a fourth wiring connected to the second floating diffusion;
a fifth wiring connected to the fourth floating diffusion; and
a sixth wiring connected to ground and capacitively coupled to the fourth wiring and the fifth wiring.
(10) The imaging device of one or more of (1) to (9), wherein the fourth wiring overlaps the photoelectric conversion region and has a fourth pattern, the fifth wiring overlaps the photoelectric conversion region and has a fifth pattern, and the sixth wiring overlaps the photoelectric conversion region and has a sixth pattern.
(11) The imaging device of one or more of (1) to (10), wherein the sixth pattern has line symmetry in a first direction.
(12) The imaging device of one or more of (1) to (11), wherein the fourth pattern and the fifth pattern form a combination pattern that includes an interdigitated section where portions of the sixth wiring are interdigitated with portions of the fourth wiring and the fifth wiring.
(13) The imaging device of one or more of (1) to (12), wherein the interdigitated section has line symmetry in a first direction.
(14) The imaging device of one or more of (1) to (13), wherein the first pattern, the second pattern, and the third pattern have point symmetry with respect to a reference point.
(15) The imaging device of one or more of (1) to (14), further comprising:
a third wiring layer including a plurality of vertical signal lines that overlap the photoelectric conversion region.
(16) The imaging device of one or more of (1) to (15), further comprising:
a fourth wiring layer that includes a first gate wiring and a first gate pad electrically connected to a gate of the first transfer transistor and a gate of fifth transfer transistor of another pixel, and a second gate wiring and a second gate pad electrically connected to a gate of the second transfer transistor and a gate of a sixth transfer transistor of the another pixel.
(17) The imaging device of one or more of (1) to (16), further comprising:
a fifth wiring layer including:
a first contact strip electrically connected to the first gate pad; and
a second contact strip electrically connected to the second gate pad.
(18) The imaging device of one or more of (1) to (17), wherein the first gate wiring, the first gate pad, and the first contact strip overlap the photoelectric conversion region.
(19) A system, comprising:
a light source; and
an imaging device including:
a pixel including:
a photoelectric conversion region;
a first transfer transistor coupled to the photoelectric conversion region to transfer charge generated by the photoelectric conversion region;
a first floating diffusion coupled to the first transfer transistor;
a second floating diffusion;
a second transfer transistor coupled between the first floating diffusion and the second floating diffusion to control access to the second floating diffusion;
a third transfer transistor coupled to the photoelectric conversion region to transfer charge generated by the photoelectric conversion region; and
a third floating diffusion coupled to the second transfer transistor;
a fourth floating diffusion; and
a fourth transfer transistor coupled between the third floating diffusion and the fourth floating diffusion to control access to the fourth floating diffusion; and
a first wiring layer including:
a first wiring connected to the second floating diffusion;
a second wiring connected to the fourth floating diffusion; and
a third wiring connected to ground and capacitively coupled with the first wiring and the second wiring.
(20) An imaging device, comprising:
a pixel including:
a photoelectric conversion region;
a first transfer transistor coupled to the photoelectric conversion region to transfer charge generated by the photoelectric conversion region;

a first floating diffusion coupled to the first transfer transistor;
a second floating diffusion;
a second transfer transistor coupled between the first floating diffusion and the second floating diffusion to control access to the second floating diffusion;
a third transfer transistor coupled to the photoelectric conversion region to transfer charge generated by the photoelectric conversion region; and
a third floating diffusion coupled to the second transfer transistor;
a fourth floating diffusion; and
a fourth transfer transistor coupled between the third floating diffusion and the fourth floating diffusion to control access to the fourth floating diffusion; and
a first wiring layer including:
a first wiring connected to the second floating diffusion;
a second wiring connected to the fourth floating diffusion; and
a third wiring connected to ground and capacitively coupled with the first wiring and the second wiring, wherein the first wiring, the second wiring, and the third wiring form a symmetrical pattern.

Any one or more of the aspects/embodiments as substantially disclosed herein.

Any one or more of the aspects/embodiments as substantially disclosed herein optionally in combination with any one or more other aspects/embodiments as substantially disclosed herein.

One or more means adapted to perform any one or more of the above aspects/embodiments as substantially disclosed herein.

It is claimed:

1. An imaging device, comprising:
a pixel including:
a photoelectric conversion region;
a first transfer transistor coupled to the photoelectric conversion region to transfer charge generated by the photoelectric conversion region;
a first floating diffusion coupled to the first transfer transistor;
a second floating diffusion;
a second transfer transistor coupled between the first floating diffusion and the second floating diffusion to control access to the second floating diffusion;
a third transfer transistor coupled to the photoelectric conversion region to transfer charge generated by the photoelectric conversion region;
a third floating diffusion coupled to the second transfer transistor;
a fourth floating diffusion; and
a fourth transfer transistor coupled between the third floating diffusion and the fourth floating diffusion to control access to the fourth floating diffusion; and
a first wiring layer including:
a first wiring connected to the second floating diffusion;
a second wiring connected to the fourth floating diffusion; and
a third wiring connected to ground and capacitively coupled with the first wiring and the second wiring.

2. The imaging device of claim 1, wherein the first wiring overlaps the photoelectric conversion region and has a first pattern, the second wiring overlaps the photoelectric conversion region and has a second pattern, and the third wiring overlaps the photoelectric conversion region and has a third pattern.

3. The imaging device of claim 2, wherein the third pattern has line symmetry in a first direction.

4. The imaging device of claim 2, wherein the first pattern and the second pattern form a combination pattern that includes an interdigitated section where portions of the third wiring are interdigitated with portions of the first wiring and the second wiring.

5. The imaging device of claim 4, wherein the interdigitated section has line symmetry in a first direction.

6. The imaging device of claim 4, wherein the interdigitated section is asymmetrical.

7. The imaging device of claim 2, wherein the first pattern, the second pattern, and the third pattern have point symmetry with respect to a reference point.

8. The imaging device of claim 1, wherein the wiring layer includes:
a fourth wiring that connects the first floating diffusion to a first amplification transistor; and
a fifth wiring that connects the third floating diffusion to a second amplification transistor, wherein the fourth and fifth wirings include dummy portions.

9. The imaging device of claim 8, wherein patterns of the fourth wiring and the fifth wiring have point symmetry with respect to a reference point.

10. The imaging device of claim 1, further comprising:
a second wiring layer including:
a fourth wiring connected to the second floating diffusion;
a fifth wiring connected to the fourth floating diffusion; and
a sixth wiring connected to ground and capacitively coupled to the fourth wiring and the fifth wiring.

11. The imaging device of claim 10, wherein the fourth wiring overlaps the photoelectric conversion region and has a fourth pattern, the fifth wiring overlaps the photoelectric conversion region and has a fifth pattern, and the sixth wiring overlaps the photoelectric conversion region and has a sixth pattern.

12. The imaging device of claim 11, wherein the sixth pattern has line symmetry in a first direction.

13. The imaging device of claim 11, wherein the fourth pattern and the fifth pattern form a combination pattern that includes an interdigitated section where portions of the sixth wiring are interdigitated with portions of the fourth wiring and the fifth wiring.

14. The imaging device of claim 13, wherein the interdigitated section has line symmetry in a first direction.

15. The imaging device of claim 10, further comprising:
a third wiring layer including a plurality of vertical signal lines that overlap the photoelectric conversion region.

16. The imaging device of claim 15, further comprising:
a fourth wiring layer that includes a first gate wiring and a first gate pad electrically connected to a gate of the first transfer transistor and a gate of fifth transfer transistor of another pixel, and a second gate wiring and a second gate pad electrically connected to a gate of the second transfer transistor and a gate of a sixth transfer transistor of the another pixel.

17. The imaging device of claim 16, further comprising:
a fifth wiring layer including:
a first contact strip electrically connected to the first gate pad; and
a second contact strip electrically connected to the second gate pad.

18. The imaging device of claim 17, wherein the first gate wiring, the first gate pad, and the first contact strip overlap the photoelectric conversion region.

19. A system, comprising:
a light source; and
an imaging device including:
a pixel including:
a photoelectric conversion region;
a first transfer transistor coupled to the photoelectric conversion region to transfer charge generated by the photoelectric conversion region;
a first floating diffusion coupled to the first transfer transistor;
a second floating diffusion;
a second transfer transistor coupled between the first floating diffusion and the second floating diffusion to control access to the second floating diffusion;
a third transfer transistor coupled to the photoelectric conversion region to transfer charge generated by the photoelectric conversion region;
a third floating diffusion coupled to the second transfer transistor;
a fourth floating diffusion; and
a fourth transfer transistor coupled between the third floating diffusion and the fourth floating diffusion to control access to the fourth floating diffusion; and
a first wiring layer including:
a first wiring connected to the second floating diffusion;
a second wiring connected to the fourth floating diffusion; and
a third wiring connected to ground and capacitively coupled with the first wiring and the second wiring.

20. An imaging device, comprising:
a pixel including:
a photoelectric conversion region;
a first transfer transistor coupled to the photoelectric conversion region to transfer charge generated by the photoelectric conversion region;
a first floating diffusion coupled to the first transfer transistor;
a second floating diffusion;
a second transfer transistor coupled between the first floating diffusion and the second floating diffusion to control access to the second floating diffusion;
a third transfer transistor coupled to the photoelectric conversion region to transfer charge generated by the photoelectric conversion region;
a third floating diffusion coupled to the second transfer transistor;
a fourth floating diffusion; and
a fourth transfer transistor coupled between the third floating diffusion and the fourth floating diffusion to control access to the fourth floating diffusion; and
a first wiring layer including:
a first wiring connected to the second floating diffusion;
a second wiring connected to the fourth floating diffusion; and
a third wiring connected to ground and capacitively coupled with the first wiring and the second wiring, wherein the first wiring, the second wiring, and the third wiring form a symmetrical pattern.

* * * * *